US012764928B2

(12) United States Patent
Karda et al.

(10) Patent No.: US 12,764,928 B2
(45) Date of Patent: Oct. 13, 2026

(54) HYBRID GATE DIELECTRIC ACCESS DEVICE FOR VERTICAL THREE-DIMENSIONAL MEMORY

(71) Applicant: Micron Technology, Inc., Boise, ID (US)

(72) Inventors: Kamal M. Karda, Boise, ID (US); Haitao Liu, Boise, ID (US); Scott E. Sills, Boise, ID (US); Si-Woo Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 380 days.

(21) Appl. No.: 18/542,299

(22) Filed: Dec. 15, 2023

(65) Prior Publication Data

US 2024/0206152 A1 Jun. 20, 2024

Related U.S. Application Data

(60) Provisional application No. 63/433,175, filed on Dec. 16, 2022.

(51) Int. Cl.

| | |
|---|---|
| ***H10B 12/00*** | (2023.01) |
| ***H10D 30/01*** | (2025.01) |
| ***H10D 30/43*** | (2025.01) |
| ***H10D 30/67*** | (2025.01) |
| ***H10D 62/10*** | (2025.01) |

(52) U.S. Cl.

CPC ............. *H10B 12/31* (2023.02); *H10B 12/03* (2023.02); *H10B 12/05* (2023.02); *H10B 12/482* (2023.02); *H10D 30/014* (2025.01); *H10D 30/43* (2025.01); *H10D 30/6735* (2025.01); *H10D 30/6757* (2025.01); *H10D 62/121* (2025.01)

(58) Field of Classification Search

CPC ........ H10B 12/03; H10B 12/05; H10B 12/30; H10B 12/31; H10B 12/482; H10D 30/014; H10D 30/43; H10D 30/6728; H10D 30/6735; H10D 30/6757; H10D 62/121

See application file for complete search history.

(56) References Cited

U.S. PATENT DOCUMENTS 7,763,953 B2 * 7/2010 Tanioku ................. H10D 1/694 257/532
2002/0115252 A1 * 8/2002 Haukka ................... C23C 16/40 257/E21.01
2002/0130340 A1 * 9/2002 Ma ..................... H10D 64/0134 257/295
2005/0258475 A1 * 11/2005 Aronowitz ........... H10D 64/691 257/324
2006/0001111 A1 * 1/2006 Tsuchiya ............ H10D 30/6757 257/E29.151

(Continued)

*Primary Examiner* — Shaun M Campbell
(74) *Attorney, Agent, or Firm* — Brooks, Cameron & Huebsch, PLLC

(57) ABSTRACT

Systems, methods and apparatus are provided for a hybrid gate dielectric access device for vertical three-dimensional (3D) memory. The memory cell has a first horizontally oriented access device having a first source/drain region and a second source/drain region separated by a first channel region. The first access device is operatively controlled by a first gate. A hybrid gate dielectric separates the gate from the channel region and a horizontally oriented storage node coupled to the second source/drain region of the access device.

17 Claims, 27 Drawing Sheets

(56) References Cited

U.S. PATENT DOCUMENTS

| | | | | |
|---|---|---|---|---|
| 2012/0205648 | A1* | 8/2012 | Yokozeki | H10D 30/6755 257/E29.1 |
| 2020/0411523 | A1 | 12/2020 | Shin | |
| 2022/0335982 | A1* | 10/2022 | He | H10D 62/118 |

* cited by examiner

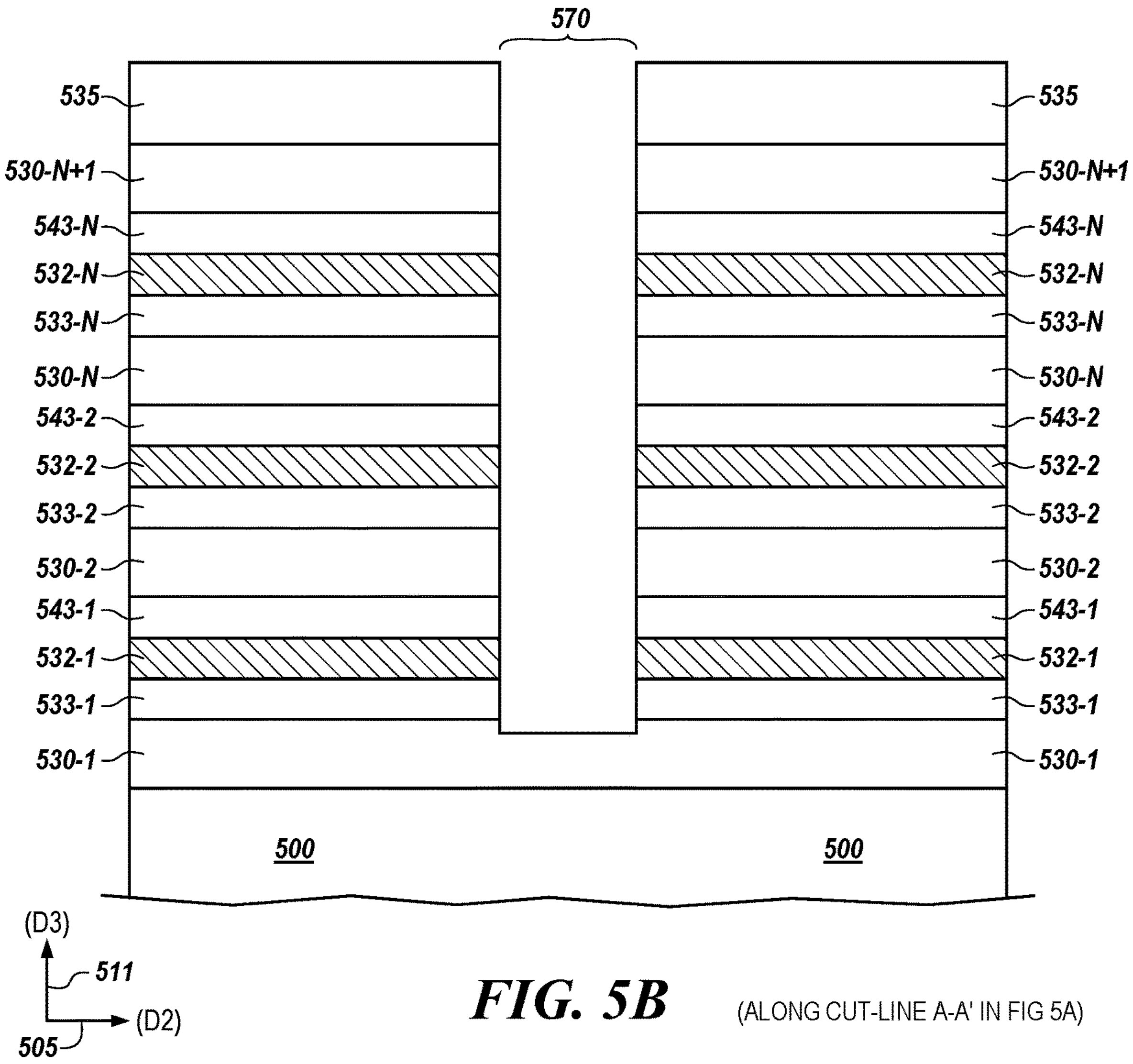
FIG. 5B (ALONG CUT-LINE A-A' IN FIG 5A)

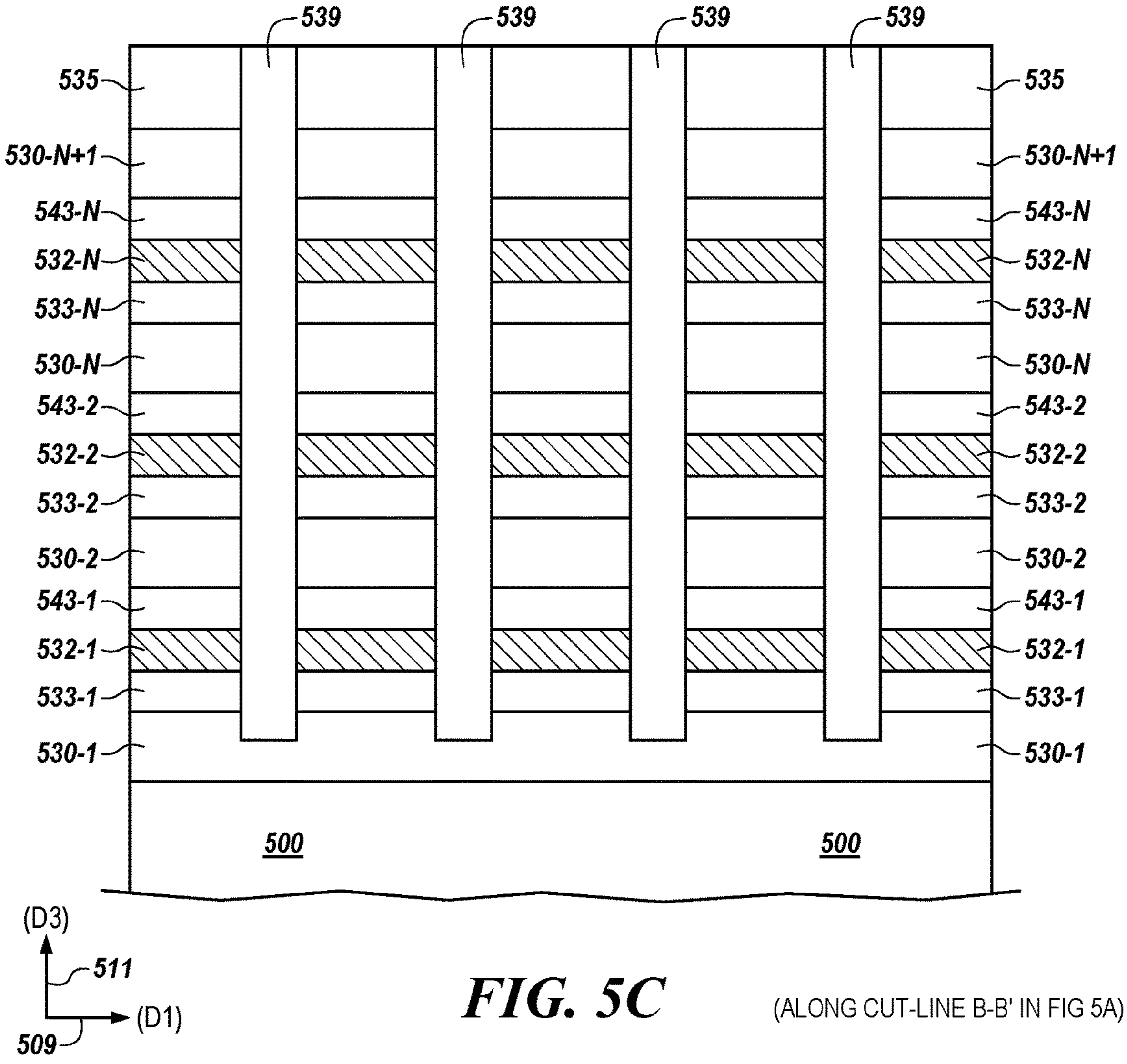
FIG. 5C (ALONG CUT-LINE B-B' IN FIG 5A)

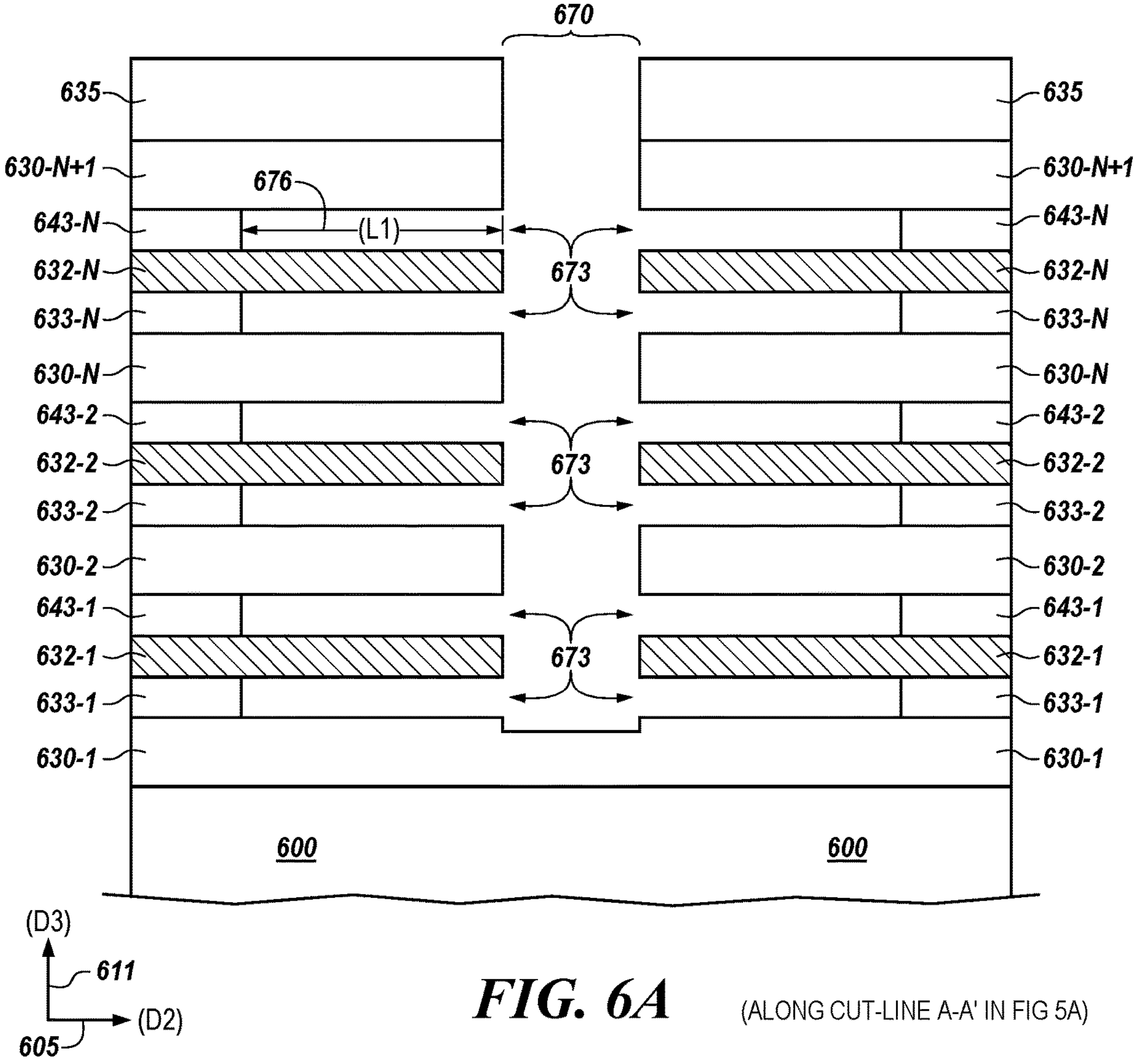
FIG. 6A (ALONG CUT-LINE A-A' IN FIG 5A)

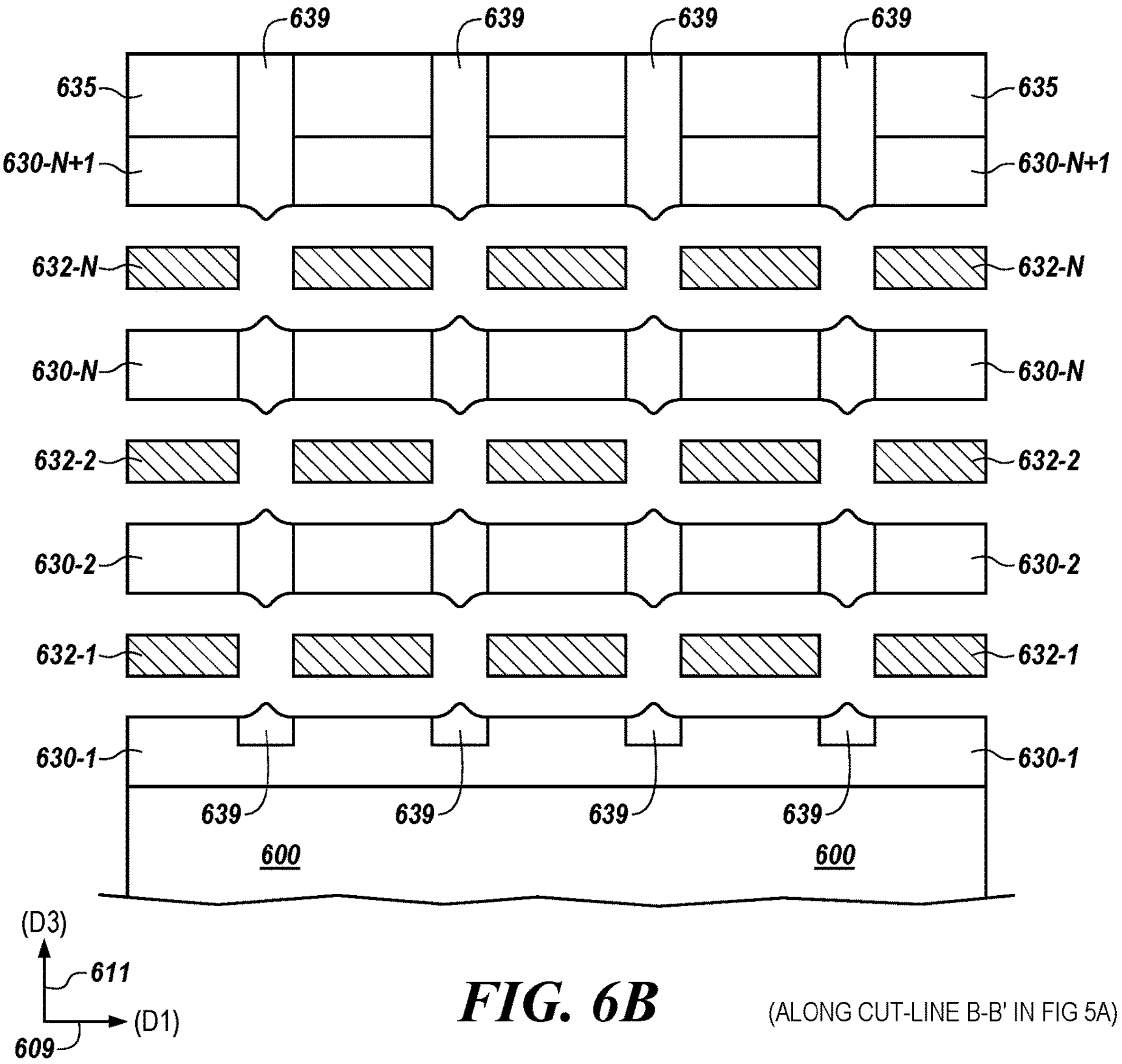
FIG. 6B (ALONG CUT-LINE B-B' IN FIG 5A)

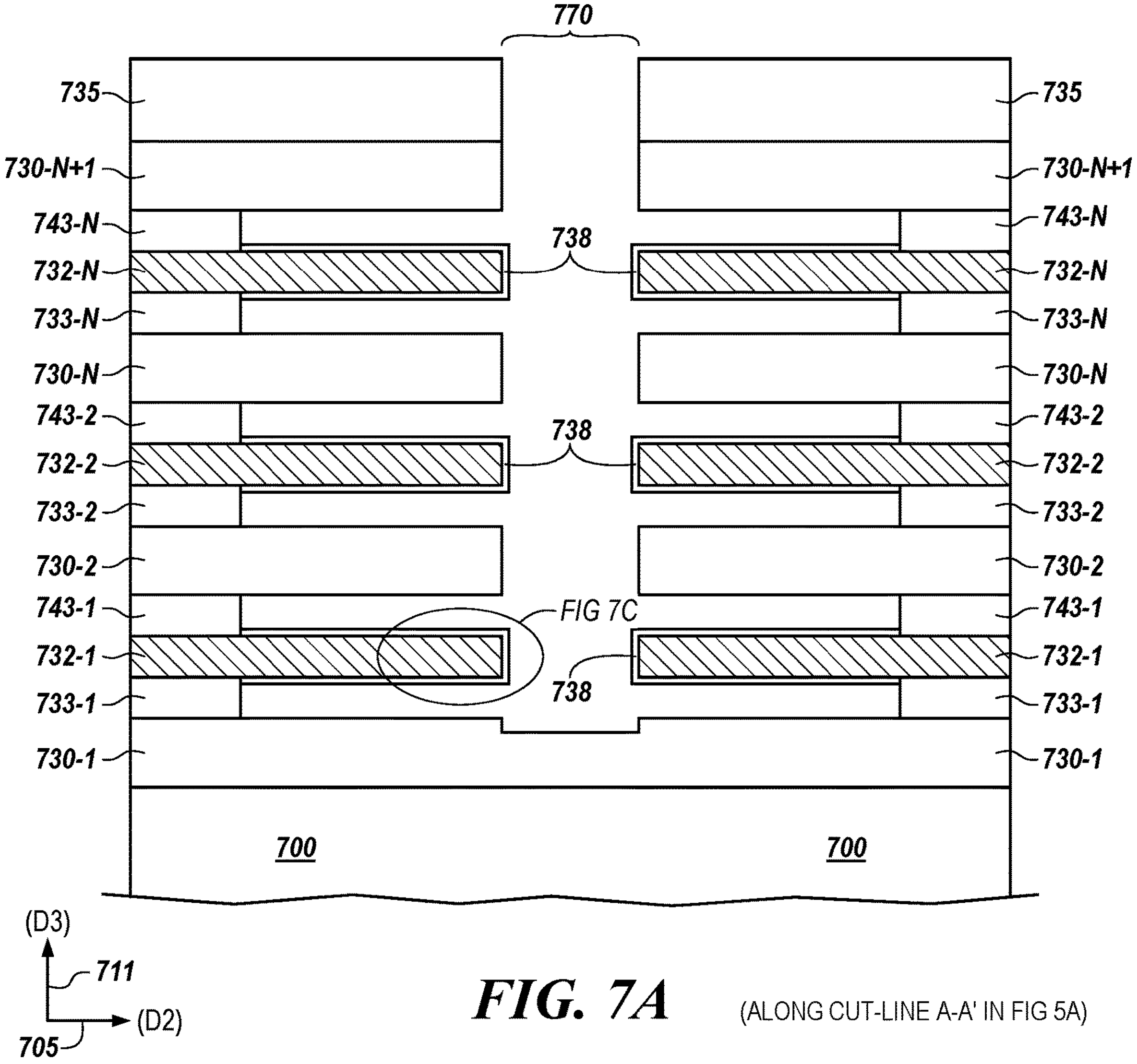
*FIG. 7A* (ALONG CUT-LINE A-A' IN FIG 5A)

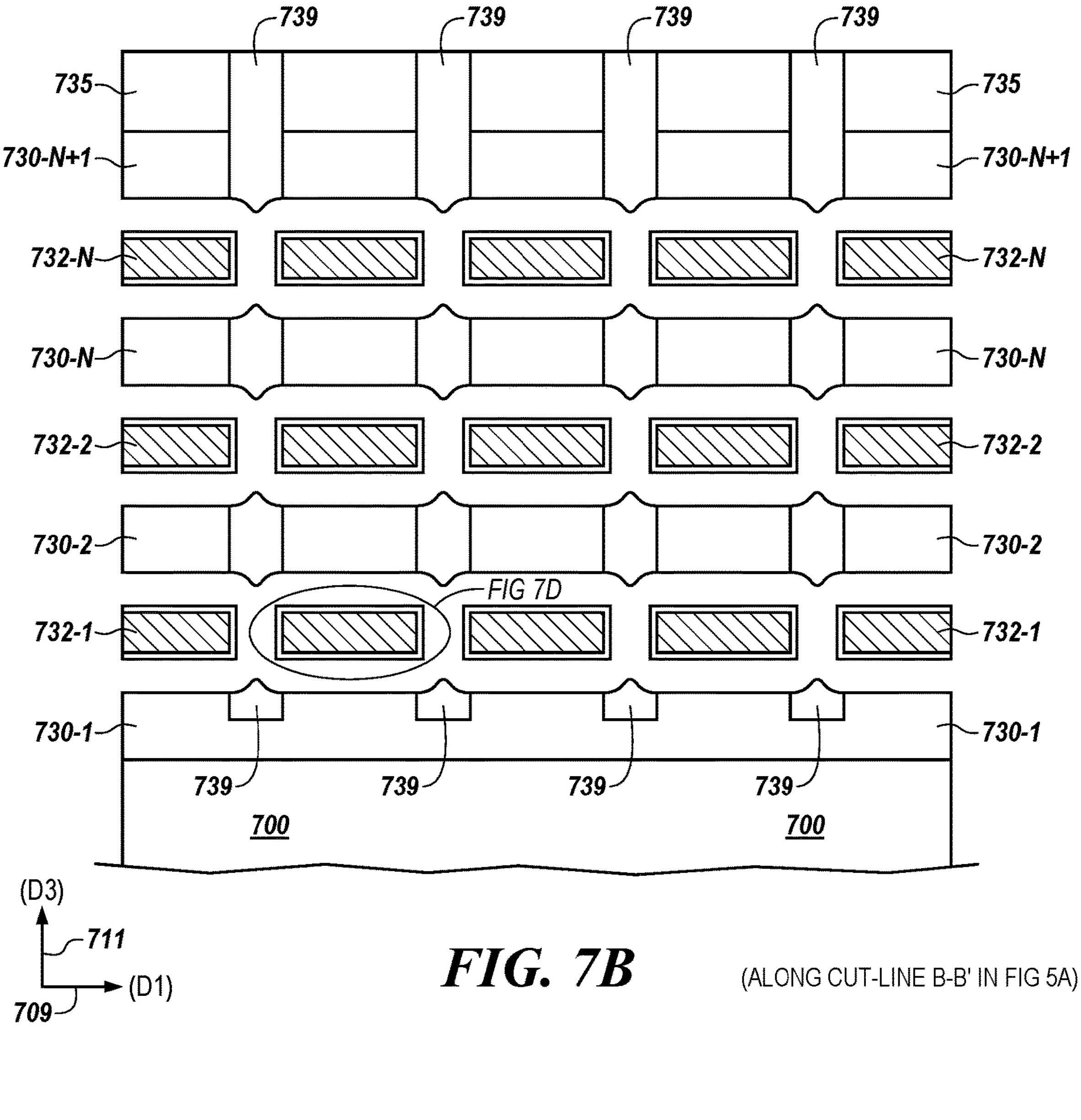
FIG. 7B (ALONG CUT-LINE B-B' IN FIG 5A)

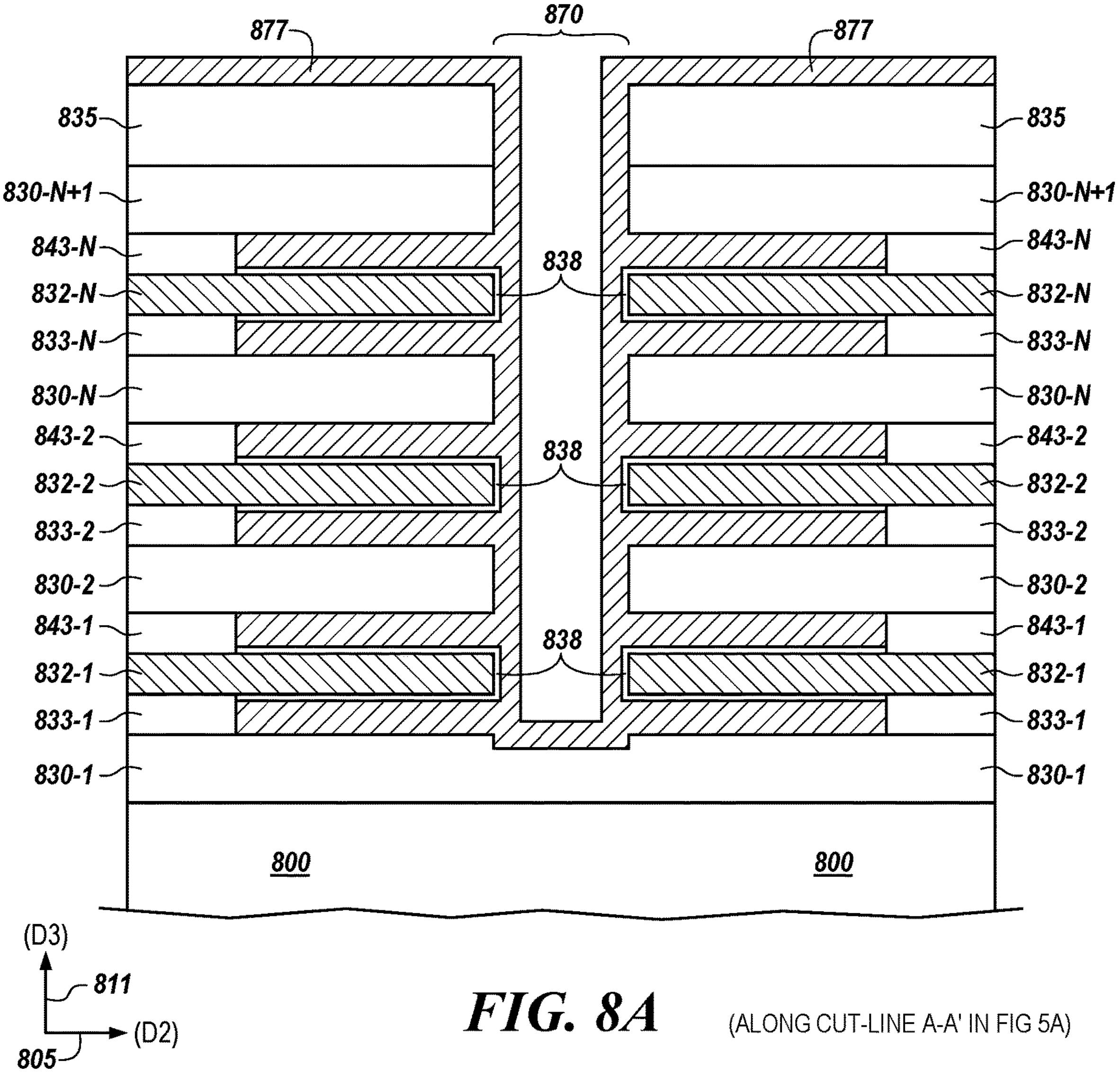
*FIG. 8A* (ALONG CUT-LINE A-A' IN FIG 5A)

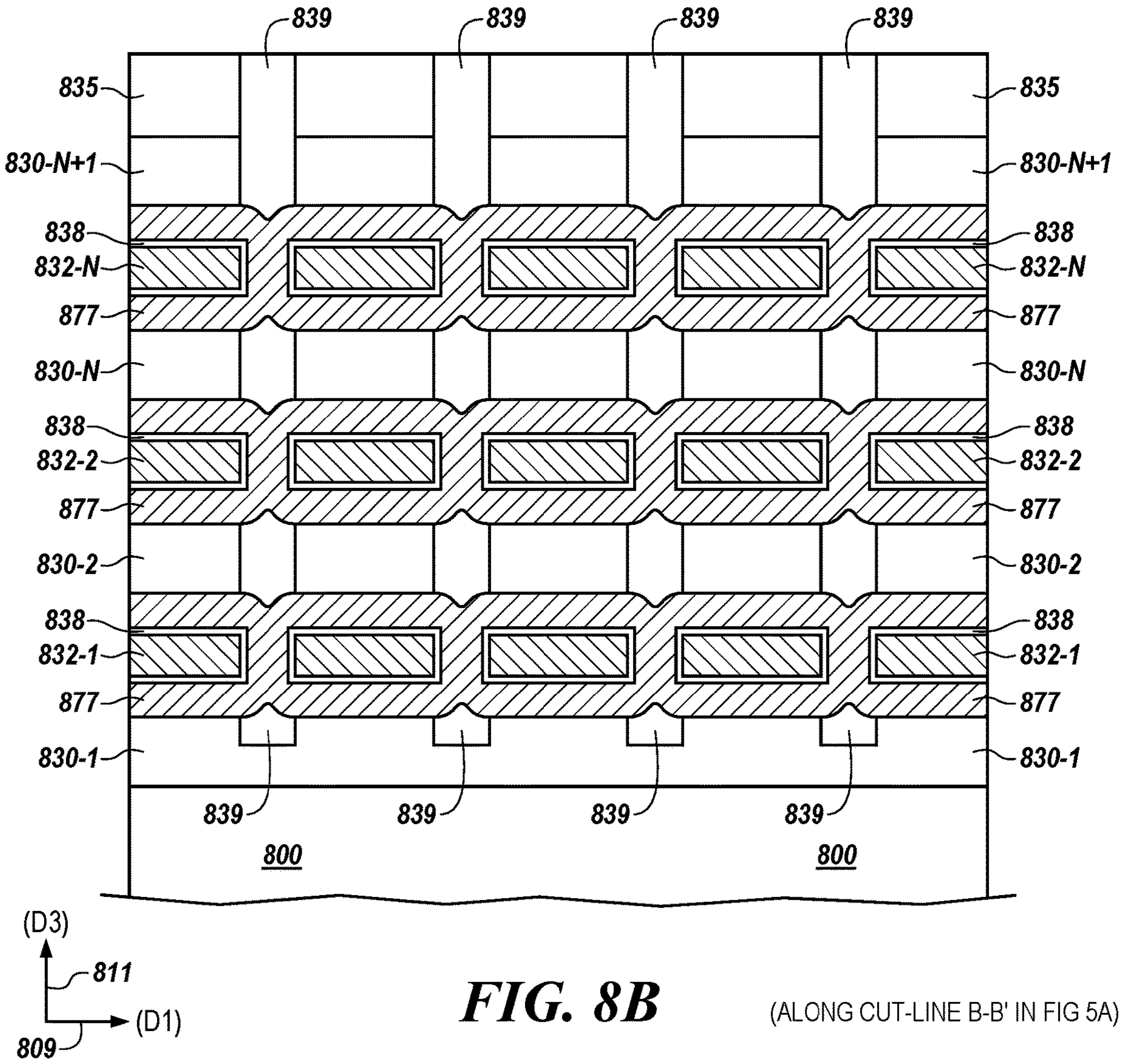
FIG. 8B (ALONG CUT-LINE B-B' IN FIG 5A)

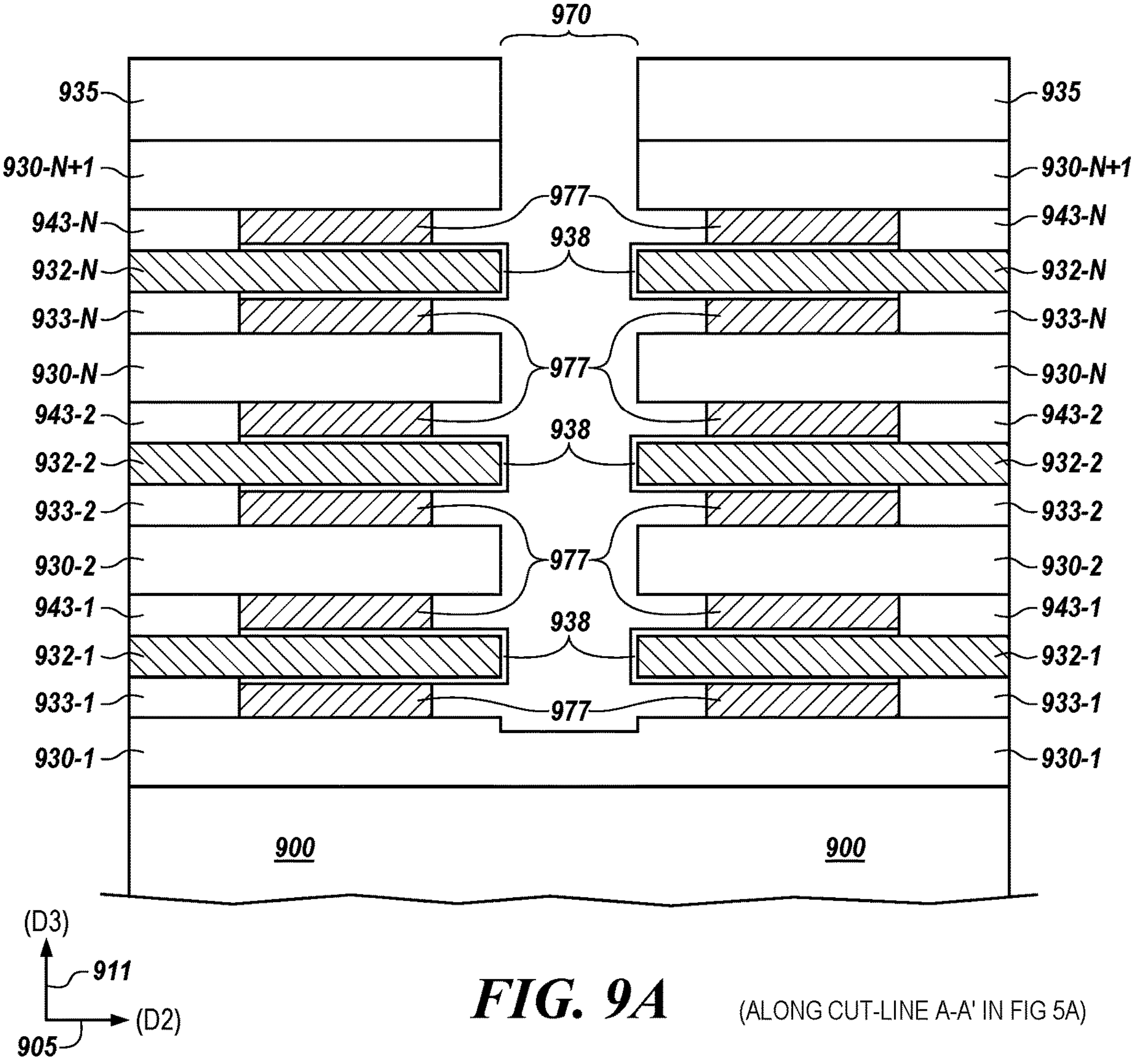
FIG. 9A (ALONG CUT-LINE A-A' IN FIG 5A)

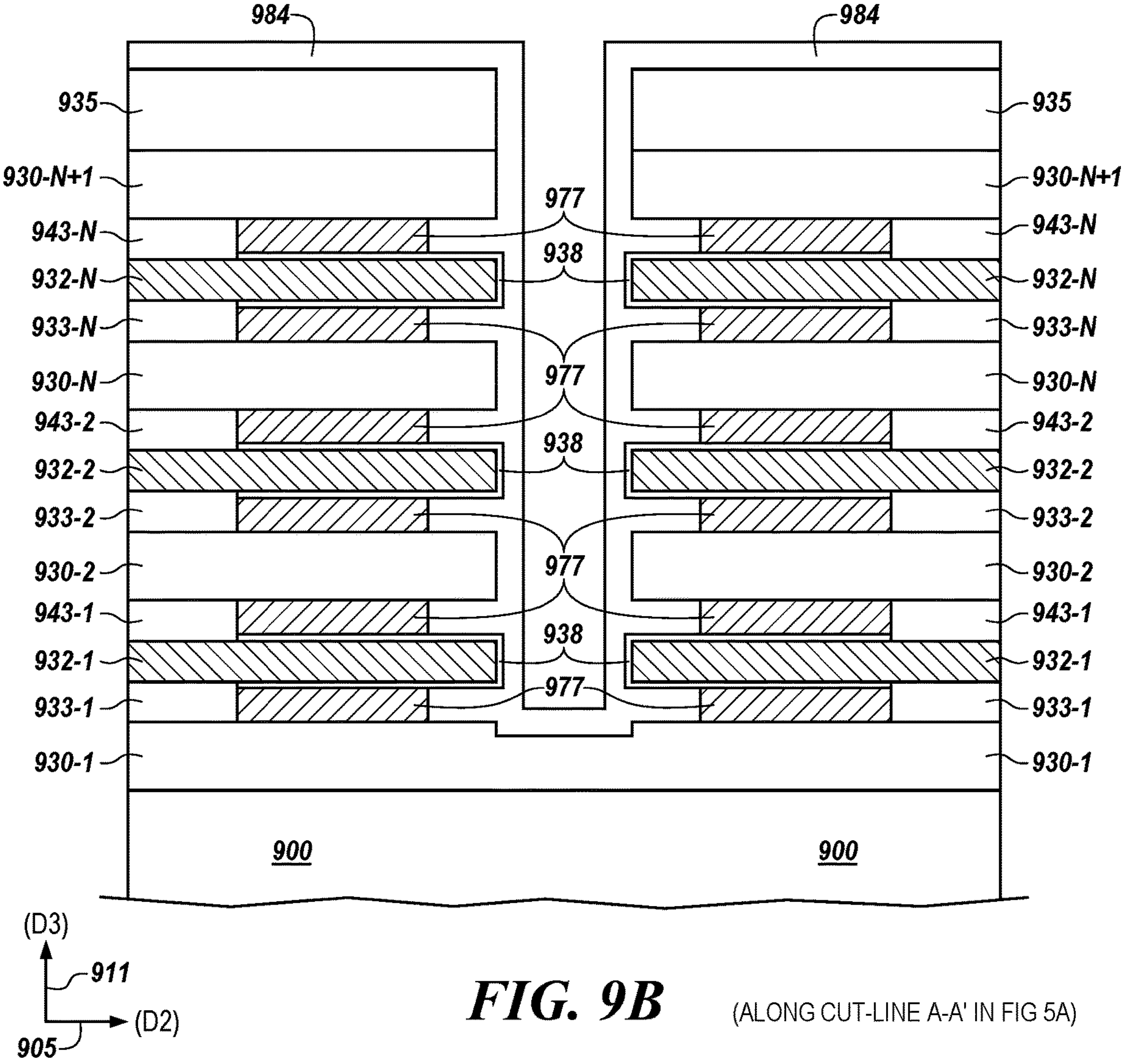
FIG. 9B (ALONG CUT-LINE A-A' IN FIG 5A)

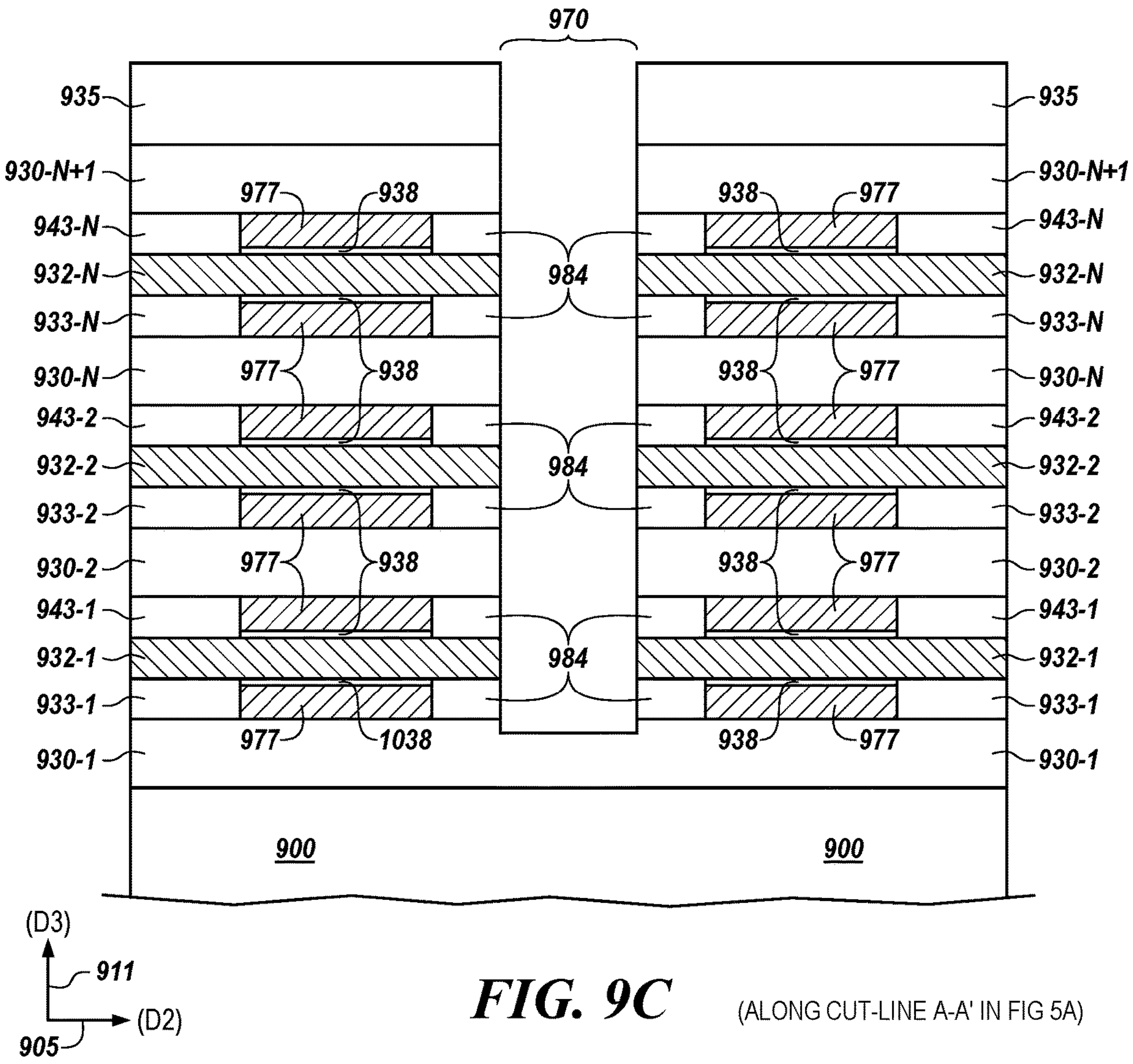
FIG. 9C (ALONG CUT-LINE A-A' IN FIG 5A)

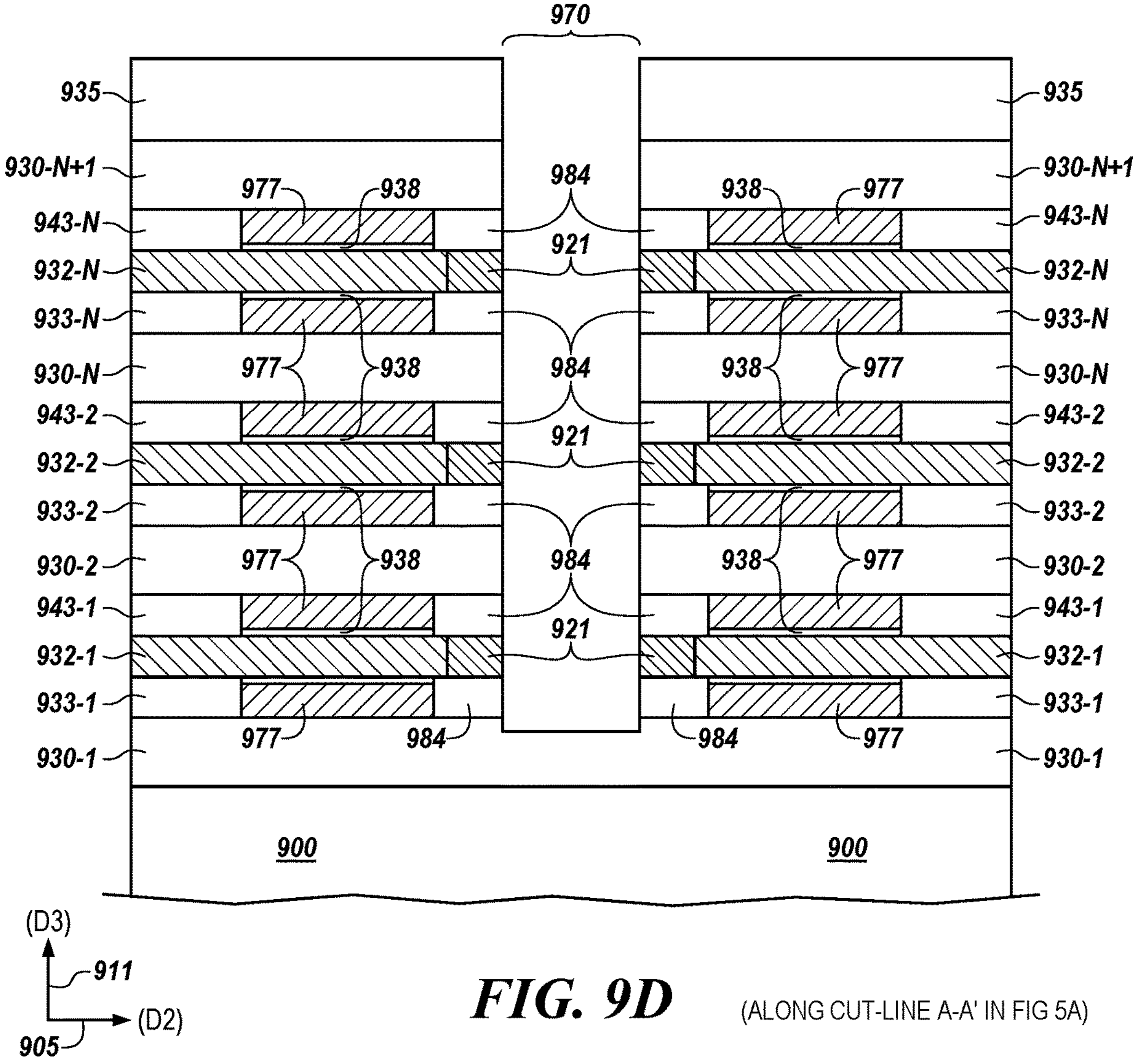
FIG. 9D (ALONG CUT-LINE A-A' IN FIG 5A)

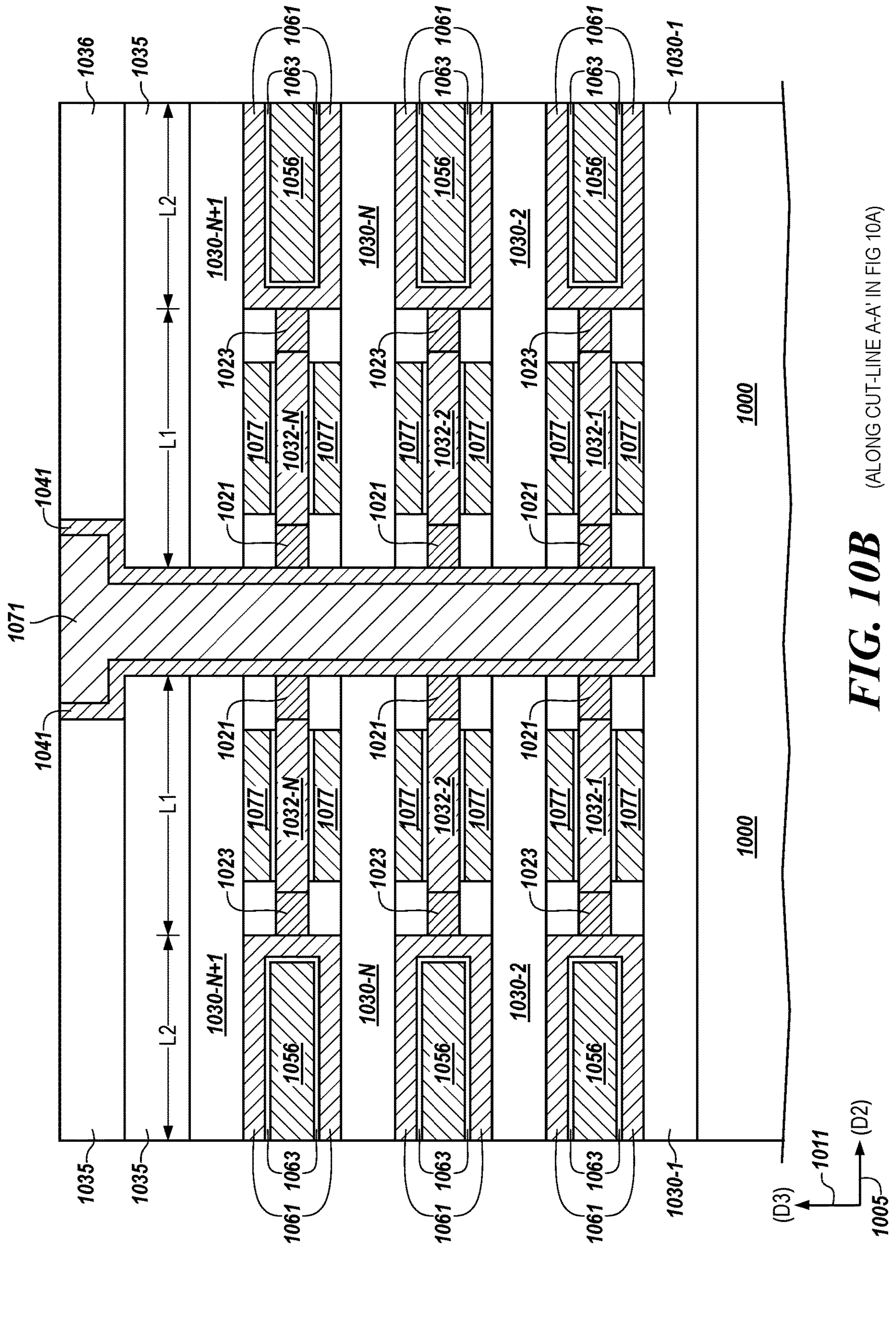
FIG. 10B (ALONG CUT-LINE A-A' IN FIG 10A)

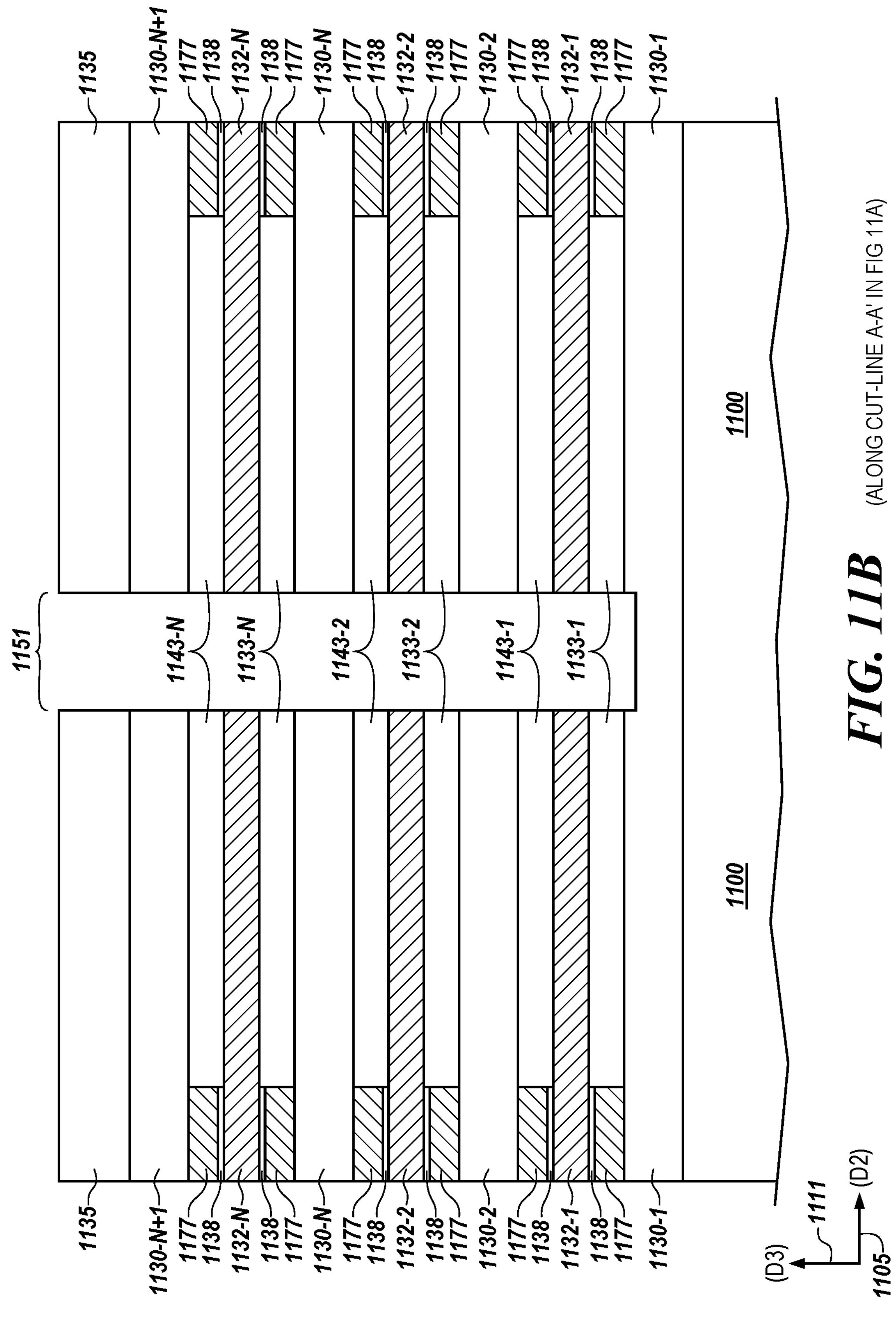
FIG. 11B (ALONG CUT-LINE A-A' IN FIG 11A)

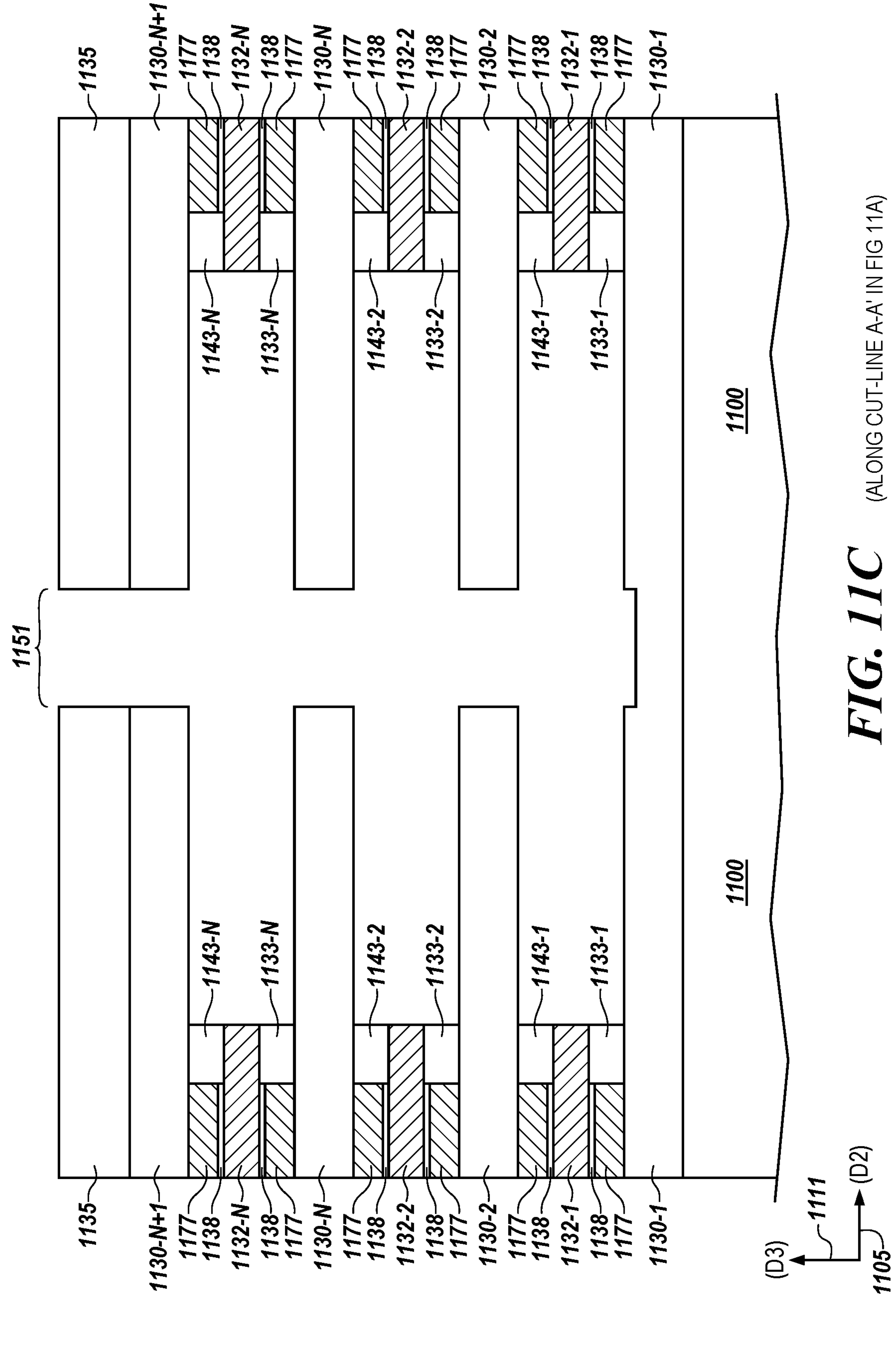
FIG. 11C (ALONG CUT-LINE A-A' IN FIG 11A)

(ALONG CUT-LINE A-A' IN FIG 11A)

(ALONG CUT-LINE A-A' IN FIG 11A)

HYBRID GATE DIELECTRIC ACCESS DEVICE FOR VERTICAL THREE-DIMENSIONAL MEMORY

PRIORITY INFORMATION

This application claims the benefit of U.S. Provisional Application No. 63/433,175, filed on Dec. 16, 2022, the contents of which are incorporated herein by reference.

TECHNICAL FIELD

The present disclosure relates generally to memory devices, and more particularly, to a hybrid gate dielectric for access devices in vertical three-dimensional (3D) memory.

BACKGROUND

Memory is often implemented in electronic systems, such as computers, cell phones, hand-held devices, etc. There are many different types of memory, including volatile and non-volatile memory. Volatile memory may require power to maintain its data and may include random-access memory (RAM), dynamic random-access memory (DRAM), static random-access memory (SRAM), and synchronous dynamic random-access memory (SDRAM). Non-volatile memory may provide persistent data by retaining stored data when not powered and may include NAND flash memory, NOR flash memory, nitride read only memory (NROM), phase-change memory (e.g., phase-change random access memory), resistive memory (e.g., resistive random-access memory), cross-point memory, ferroelectric random-access memory (FeRAM), or the like. Memory devices can be utilized for a wide range of electronic applications.

BRIEF DESCRIPTION OF THE DRAWINGS

FIGS. 5A-5C illustrate several views of a semiconductor structure at a particular time in the fabrication process in accordance with a number of embodiments of the present disclosure.

FIGS. 6A-6B illustrate several views of a semiconductor structure at a particular time in the fabrication process in accordance with a number of embodiments of the present disclosure.

FIGS. 7A-7D illustrate several views of a semiconductor structure at a particular time in a fabrication process in accordance with a number of embodiments of the present disclosure.

FIGS. 8A-8B illustrate several views of a semiconductor structure at a particular time in a fabrication process in accordance with a number of embodiments of the present disclosure.

FIGS. 9A-9D illustrate several views of a semiconductor structure at a particular time in a fabrication process in accordance with a number of embodiments of the present disclosure.

FIGS. 10A-10B illustrate several views of a semiconductor structure at a particular time in a fabrication process in accordance with a number of embodiments of the present disclosure.

FIGS. 11A-11E illustrate several views of a semiconductor structure at a particular time in the fabrication process in accordance with a number of embodiments of the present disclosure.

DETAILED DESCRIPTION

Figure 1:
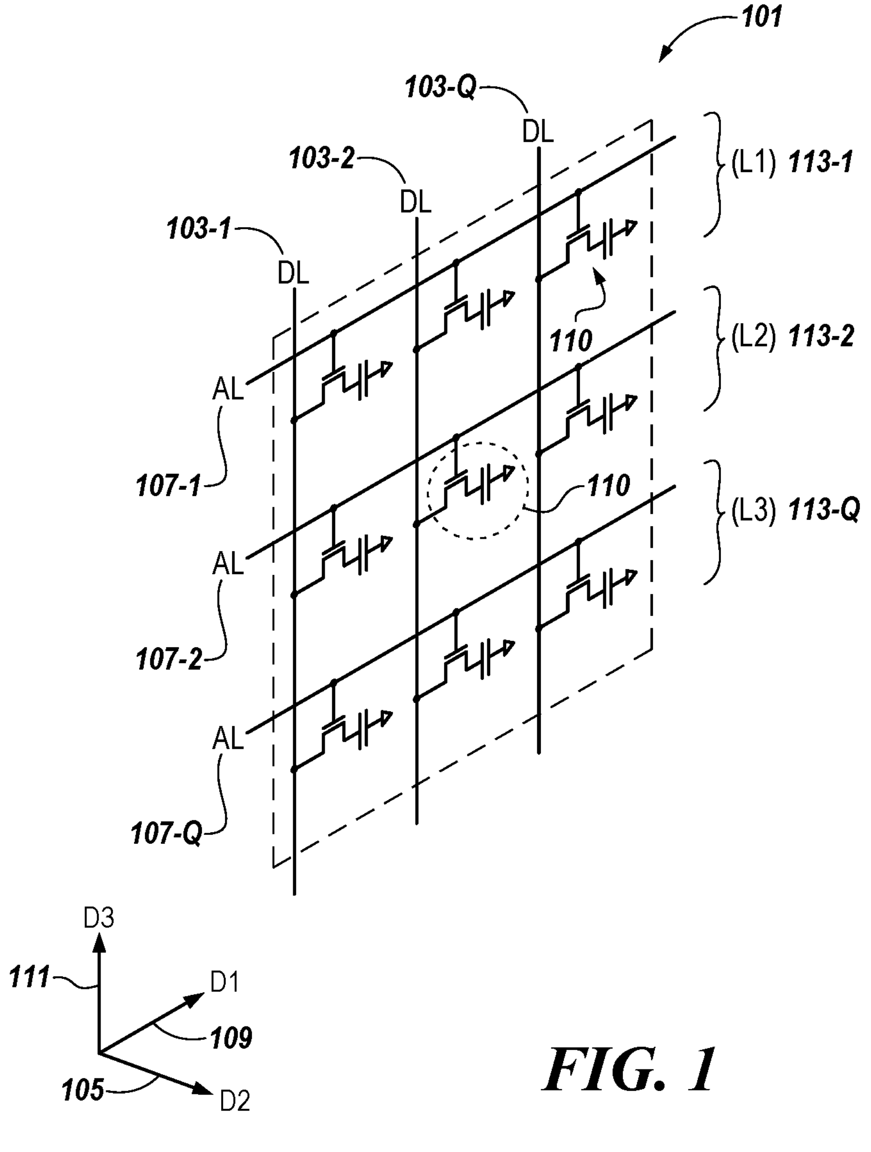
FIG. 1 is a schematic diagram illustrating a perspective view of an array of hybrid gate dielectric access devices for vertical three-dimensional (3D) memory, in accordance with a number of embodiments of the present disclosure.

Embodiments of the present disclosure describe a hybrid gate dielectric access device for vertical three-dimensional (3D) memory, In one embodiment the hybrid gate dielectric access device includes a multi-layer gate dielectric for forming a dynamic random access memory (DRAM) cell in a 3D memory. In some embodiments hybrid gate dielectric is used in a horizontally oriented access device coupled to a horizontally oriented storage node within a same plane, e.g., tier, of the vertical 3D memory. The horizontally oriented access device, e.g., transistor, may be integrated with horizontally oriented gates and vertically oriented digit lines. This provides good retention and scalability, e.g., footprint, for the memory cells, for vertical three-dimensional memories.

In DRAM scaling, there is a quest for full 3D architectures wherein multiple levels can be formed together similar to 3D NAND. As scaling decreases access current on ("Ion") needs to be boosted up, as there is uncertainty on variability, particularly for larger numbers of tiers for 3D memory. Further, the cell storage capacitance may become more marginal.

As design rules for access devices, e.g., transistors, scale smaller and smaller, fully depleted body threshold voltage (Vt) control becomes more difficult. In some instances, the Vt may be measurably lower for horizontally oriented vertically stacked access devices than as used with buried recessed access device (BRAD) architectures, e.g., approximately 500 milli-Volts (mV) lower than the Vt used in BRAD operation. Embodiments described herein may enable a higher threshold voltage (Vt) and better access device conduction control, e.g., current "off" (Ioff) for vertical three-dimensional (3D) memory, e.g., comparable to BRAD devices of a similar design rule scale and operating parameters.

According to embodiments described herein, a hybrid gate dielectric access device for 3D memory uses a multi-layer gate dielectric wherein a first layer is a first dielectric layer material composition and a second layer is a second dielectric layer material composition. The second dielectric layer material composition is different from the first layer, can tolerate a high thermal budget, e.g., approximately 1000 degrees Celsius)(° ° C., suppress Fowler-Nordheim (Fn) tunneling, and provide a greater, total equivalent oxide thickness (EOT) by approximately twenty (20) or greater Angstroms (Å) relative to similar design rule scale and operating parameters. In some embodiments the second layer may be thinner than the first layer. In some embodiments, the second layer includes a dielectric layer material composition with a high effective fixed negative charge, e.g., a fixed negative charge density at least equal to or greater than approximately $-1e^{12}/cm^2$ ($-1e^{12}/cm^2$).

Further, according to embodiments, using a hybrid gate dielectric achieves a smaller electric field (efield) inside the gate dielectric, without degrading underlap resistance, and while maintaining access device conduction control for current "on" (Ion) in a vertically stacked three-dimensional (3D) memory architecture, having horizontally oriented access devices coupled to horizontally oriented storage nodes. This may relax the "current off" ("Ioff") requirements, lessening current leakage in the access device "off" state while realizing equivalent charge storage retention for thin film transistor (TFT) applications.

The figures herein follow a numbering convention in which the first digit or digits correspond to the figure number of the drawing and the remaining digits identify an element or component in the drawing. Similar elements or components between different figures may be identified by the use of similar digits. For example, reference numeral 223 may reference element "23" in FIG. 2, and a similar element may be referenced as 323 in FIG. 3. Multiple analogous elements within one figure may be referenced with a reference numeral followed by a hyphen and another numeral or a letter. For example, 207-1 may reference element 207-1 in FIGS. 2 and 207-2 may reference element 207-2, which may be analogous to element 207-1. Such analogous elements may be generally referenced without the hyphen and extra numeral or letter. For example, elements 207-1 and 207-2 or other analogous elements may be generally referenced as 207.

Figure 2:
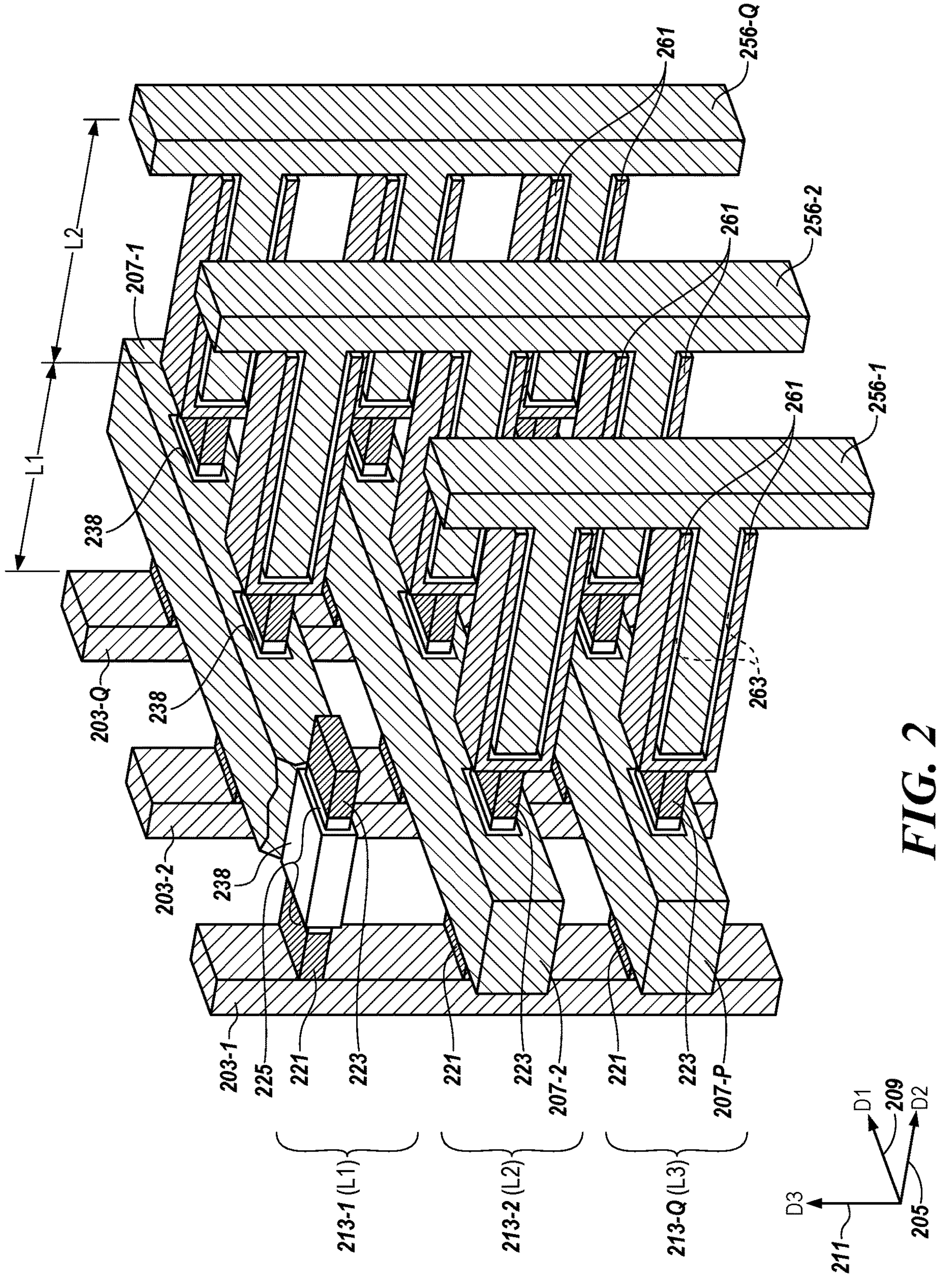
FIG. 2 is a perspective view illustrating a portion of an array having hybrid gate dielectrics in access devices for vertical three-dimensional (3D) memory, in accordance with a number of embodiments of the present disclosure.

FIGS. 1 and 2 are illustrations of portions of a vertical 3D memory in accordance a number of embodiments of the present disclosure. FIG. 1 illustrates a circuit diagram showing a cell array of a 3D semiconductor memory device according to an embodiment of the present disclosure having vertically oriented digit lines (e.g., vertically oriented DLs 103-1, 103-2, . . . , 103-Q) oriented in a third direction (D3) 111 and horizontally oriented gates (e.g., wordlines or access lines (AL) 107-1, 107-2, . . . , 107-Q) oriented in a first direction (D1) 109.

FIG. 1 illustrates a cell array as a sub cell array 101 arranged along a second direction (D2) 105. The sub cell array may include horizontally oriented gates 107-1, 107-2, . . . , 107-Q and vertically oriented digit lines, 103-1, 103-2, . . . , 103-Q, associated with each hybrid gate dielectric access device memory cell. According to embodiments, the first direction (D1) 109 and the second direction (D2) 105 may be considered in a horizontal ("X-Y") plane. The third direction (D3) 111 may be considered in a vertical ("Z") plane. Hence, according to embodiments described herein, the horizontally oriented gates 107-1, 107-2, . . . , 107-Q (e.g., wordlines or access lines (AL)), are extending in a horizontal direction, e.g., first direction (D1) 109. and the vertically oriented digit lines, 103-1, 103-2, . . . , 103-Q, are oriented in the third direction (D3) 111. Memory cells may be written to, or read from, using the horizontally oriented gates 107-1, 107-2, . . . , 107-Q, and the vertically oriented digit lines, 103-1, 103-2, . . . , 103-Q.

As shown in the example embodiment of FIG. 1, the array of vertically oriented memory cells may be extending in a vertical direction, e.g., third direction (D3) 111. According to some embodiments the vertically oriented stack of memory cells may be fabricated such that the memory cells are formed on plurality of vertical levels (e.g., a first level 113-1 (L1), a second level 113-2 (L2), and a third level 113-Q (L3)).

FIG. 2 is a perspective views illustrating a portion of a semiconductor device in accordance with a number of embodiments of the present disclosure. FIG. 2 illustrates an example embodiment of hybrid gate dielectric access devices being horizontally oriented and coupled to horizontally oriented storage nodes. FIG. 2 illustrates an embodiment of the multiple unit cells, in multiple tiers, within a three-dimensional (3D) memory array.

In the example embodiment of FIG. 2, each hybrid gate dielectric access device includes a first source/drain region 221 and a second source/drain region 223 separated by a channel region 225. The channel regions 225 is controlled by horizontally oriented gates 207-1, 207-2, . . . , 207-P, in each respective tier, 213-1 (L1), 213-2 (L2), . . . , 213-Q (L3), and separated from the channel regions 225 by hybrid gate dielectrics 238, described in greater detail in connection with FIGS. 7A-7D. The first and second source/drain regions 221 and 223 may be impurity doped regions and may be formed from an n-type or p-type dopant. Embodiments are not so limited.

For example, for an n-type conductivity transistor construction the channels 225 of the access devices may be formed of a low doped (p−) p-type semiconductor material. In one embodiment, the channels 225 of the access devices, respectively separating the first and second source/drain regions 221 and 223, may include a low doped, p-type (e.g., low dopant concentration (p−)) polysilicon material consisting of boron (B) atoms as an impurity dopant to the semiconductor material (e.g., polycrystalline silicon, among others). The channels 225 of the access device may also comprise a metal, and/or metal composite materials containing ruthenium (Ru), molybdenum (Mo), nickel (Ni), titanium (Ti), copper (Cu), a highly doped degenerate semiconductor material, and/or at least one of indium oxide ($In_2O_3$), or indium tin oxide ($In_{2-x}Sn_xO_3$), formed using an atomic layer deposition process, etc. Embodiments, however, are not limited to these examples. As used herein, a degenerate semiconductor material is intended to mean a semiconductor material, such as polysilicon, containing a high level of doping with significant interaction between dopants, e.g., phosphorous (P), boron (B), etc. Non-degenerate semiconductors, by contrast, contain moderate levels of doping, where the dopant atoms are well separated from each other in the semiconductor host lattice with negligible interaction.

In some embodiments the channels 225 may include silicon, germanium, silicon-germanium, and/or indium gallium zinc oxide (IGZO). As will be explained further in connection with FIGS. 7A-7D, the hybrid gate dielectric material 238 may include a multi-layer gate dielectric composition with each layer having a different gate dielectric material composition. For example, one or more layers in the multilayer hybrid gate dielectric 238 may include a high-k dielectric material, a silicon oxide material, a silicon nitride material, a silicon oxynitride material, etc., or a combination thereof. Embodiments are not so limited. As further example, one or more layers in a high-k dielectric material composition to the hybrid gate dielectric material 238 may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobite, etc.

For the n-type conductivity transistor construction, the first and second source/drain regions 221 and 223 may include a high dopant concentration, n-type conductivity impurity (e.g., high dopant (n+) or (n++)) doped in the source/drain regions. In some embodiments, the high dopant, n-type conductivity first and second source/drain regions 221 and 223 may include a high concentration of Phosphorus (P) atoms deposited therein. Embodiments, however, are not limited to this example. In other embodiments, the channels 225 of the hybrid gate dielectric access devices may be of a n-type conductivity construction in which case the impurity, e.g., dopant, conductivity types would be reversed.

Hence, FIG. 2 is a perspective view illustrating a vertical array of hybrid gate dielectric memory cells for 3D memory according to embodiments of the present disclosure. As shown in FIG. 2, an array of vertically stacked, horizontally oriented hybrid gate dielectric, horizontally oriented access devices are coupled to horizontally oriented storage nodes to form memory cells in a vertically oriented three-dimensional (3D), multi-level (e.g., multi-tiered) 213-1, 213-2, . . . , 213-N memory array. The embodiment of FIG. 2 is illustrated with each tier 213-1, 213-2, . . . , 213-N having horizontally oriented, hybrid gate dielectric access devices horizontally oriented storage nodes. As shown in FIG. 2A, the memory cells each include a first source/drain region 221 and a second source/drain region 223 separated by a channel region 225, being operatively controlled by horizontal gates 207-1, 207-2, . . . , 207-P along rows, within tiers 213-1 (L1), 213-2 (L2), . . . , 213-Q (L3), of vertically oriented memory cells, and extending in a first direction (D1) 209. The horizontal gates 207-1, 207-2, . . . , 207-Q are separated from the channel regions 225 by hybrid gate dielectrics 238, described in greater detail in FIG. 7.

As shown in the embodiment of FIG. 2, first electrodes 261 of horizontally oriented storage nodes are coupled to the second source/drain region 223. Cell dielectrics 263 separate the first electrodes 261 from second electrodes 256-1, 256-2, . . . , 256-Q (e.g., top electrode (TE)) which may be a common electrode (CE) to a column of vertically oriented memory cells in the third direction (D3) 211. Vertical digit lines 203-1, 203-2, . . . , 203-Q are coupled to the first source/drain regions 221 of the horizontally oriented channels 225 in columns of the vertically oriented memory cells in the third direction (D3) 211. The horizontally oriented, hybrid gate dielectric access devices may have a first horizontal length (L1) and the horizontally oriented storage nodes may have a second horizontal length (L2). The first horizontal length (L1) may be different from the second horizontal length (L2).

As described herein, the horizontally oriented gate structures 207-1, 207-2, . . . , 207-P, may be formed along rows within tiers 213-1 (L1), 213-2 (L2), . . . , 213-Q (L3), of vertically oriented memory cells and extending in a first direction (D1) 209 and may form gate all around (GAA) structures opposing the channels 225 along rows within each tier 213-1 (L1), 213-2 (L2), . . . , 213-Q (L3). When actuated the GAA structures may invert a conductive path in opposing sides of the horizontal channels 225 to double a width of the conductive path in the horizontal channels 225.

As described further in connection with FIGS. 3-11, embodiments for the hybrid gate dielectric access devices described herein may have a total vertical height (ht) of less than one hundred and fifty (150) nanometers (nm). And the channels 225 may each individually have a vertical height (hc) of less than fifteen (15) nanometers (nm). In some embodiments, the horizontally oriented storage nodes each have a horizontal length (L2) of less than three hundred (300) nanometers (nm). And in some embodiments, the horizontally oriented storage nodes each have a horizontal length (L2) of less than two hundred (200) nanometers (nm). Embodiments, however, are not limited to these examples, and other design rule dimensions are included within the scope of embodiments.

Figure 3:
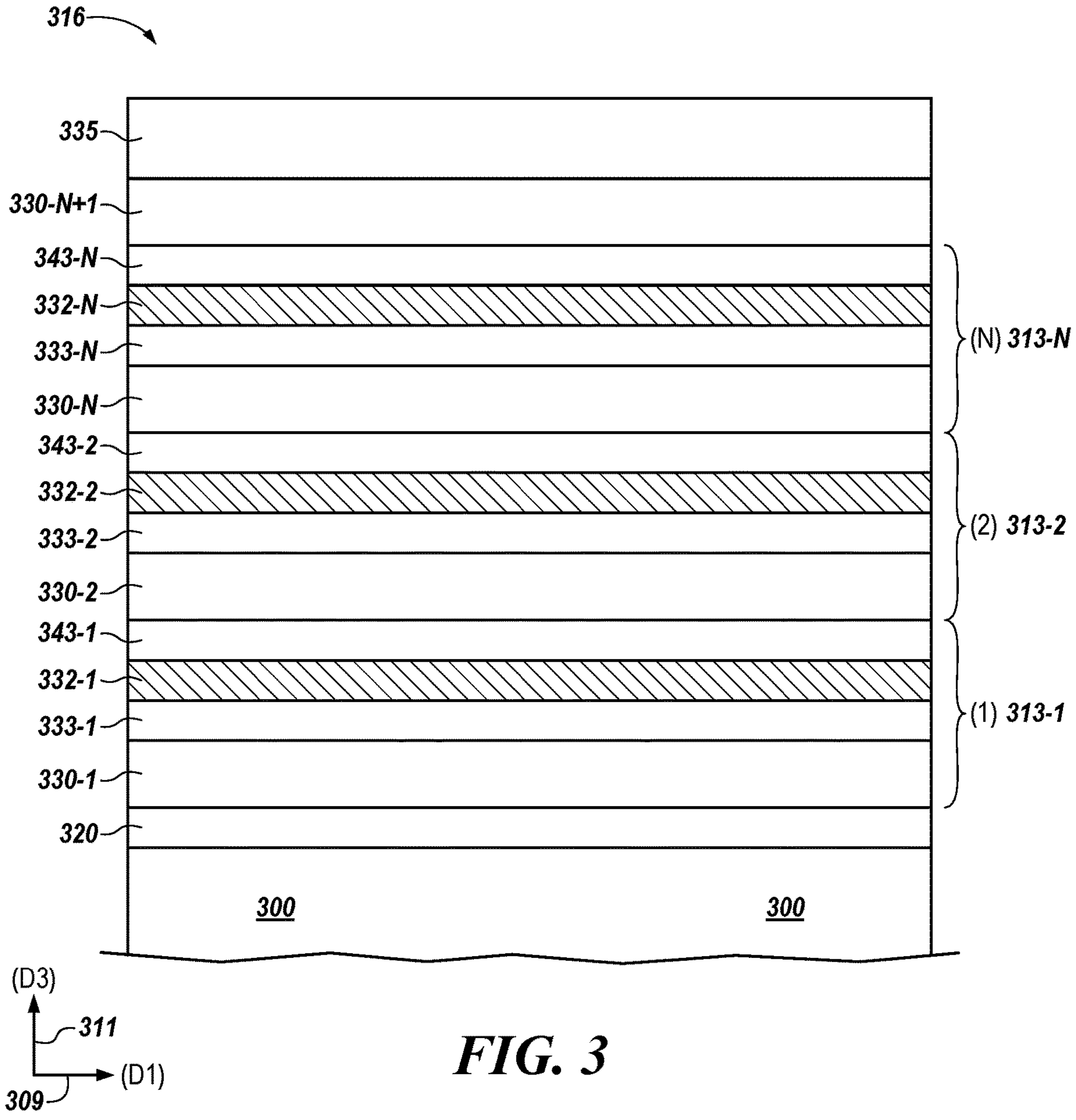
FIG. 3 illustrates a view of a semiconductor structure at a particular time in the fabrication process in accordance with a number of embodiments of the present disclosure.

FIG. 3 is a cross-sectional view for an example embodiment of a semiconductor device fabrication process for hybrid gate dielectric access devices for memory cells in vertical 3D memory in accordance with a number of embodiments of the present disclosure. In the embodiment shown in FIG. 3, a semiconductor device fabrication process comprises depositing alternating layers of a first dielectric material, 330-1, 330-2, . . . , 330-N (collectively referred to as "first" dielectric material "330"), a second dielectric material, 333-1, 333-2, . . . , 333-N (collectively referred to as "second" dielectric material "333"), a semiconductor material, 332-1, 332-2, . . . , 332-N (collectively referred to as semiconductor material "332"), and a third dielectric material, 343-1, 343-2, . . . , 343-N (third dielectric material, sometimes referred to herein collectively as third dielectric material "343"), in repeating iterations to form a vertical stack 316 on a working surface of a substrate 300. The alternating materials in the repeating, vertical stack 316 may be separated from the substrate 300 by an insulator material 320. In one embodiment, the first dielectric material 330 can be deposited to have a thickness, e.g., vertical height in the third direction (D3), in a range of twenty (20) nanometers (nm) to sixty (60) nm. In one embodiment, the second dielectric material 333 can be deposited to have a thickness, e.g., vertical height, in a range of ten (10) nm to thirty (30) nm. In one embodiment, the semiconductor material 332 can be deposited to have a thickness, e.g., vertical height, in a range of twenty (20) nm to one hundred (100) nm. In one embodiment, the third dielectric material 343 can be deposited to have a thickness, e.g., vertical height, in a range of ten (10) nm to thirty (30) nm. Embodiments, however, are not limited to these examples. As shown in FIG. 3, a vertical direction 311 is illustrated as a third direction (D3), e.g., z-direction in an x-y-z coordinate system.

In some embodiments, the first dielectric material, 330-1, 330-2, . . . , 330-N, may be an interlayer dielectric (ILD). By way of example, and not by way of limitation, the first dielectric material, 330-1, 330-2, . . . , 330-N, may comprise an oxide material, e.g., $SiO_2$. In another example the first dielectric material, 330-1, 330-2, . . . , 330-N, may comprise a silicon nitride ($Si_3N_4$) material (also referred to herein as "SiN"). In another example the first dielectric material, 330-1, 330-2, . . . , 330-N, may comprise a silicon oxy-carbide ($SiO_xC_y$) material. In another example the first dielectric material, 330-1, 330-2, . . . , 330-N, may include silicon oxy-nitride ($SiO_xN_y$) material (also referred to herein as "SiON"), and/or combinations thereof. Embodiments are not limited to these examples. According to embodiments, the first dielectric material 330 may be etched selective to the second and third dielectric materials 333 and 343.

In some embodiments the semiconductor material, 332-1, 332-2, . . . , 332-N, may comprise a silicon (Si) material in a polycrystalline and/or amorphous state. The semiconductor material 332 may be a low doped, p-type (p−) silicon material. The semiconductor material 332 may be formed by gas phase doping boron atoms (B), as an impurity dopant, at a low concentration to form the low doped, p-type (p−) silicon material. The low doped, p-type (p−) silicon material may be a polysilicon material. Embodiments, however, are not limited to these examples.

In some embodiments, the second dielectric material 333 may comprise a nitride material. The nitride material may be a silicon nitride ($Si_3N_4$) material (also referred to herein as "SiN"). In another example the second dielectric material 333 may comprise a silicon oxy-carbide (SiOC) material. In another example the second dielectric material 333 may include silicon oxy-nitride (SiON), and/or combinations thereof. Embodiments are not limited to these examples. However, according to embodiments, the second dielectric material 333 is purposefully chosen to be different in material or composition than the first dielectric material 330 and third dielectric material 343, such that a selective etch process may be performed on one of the first, second, and third dielectric layers, selective to the other ones of the first, second, and third dielectric layers, e.g., the second dielectric material 333 may be selectively etched relative to the semiconductor material 332, the first dielectric material 330, and the third dielectric material 343.

The repeating iterations of alternating first dielectric material, 330-1, 330-2, . . . , 330-N, the second dielectric material, 333-1, 333-2, . . . , 333-N, the semiconductor material, 332-1, 332-2, . . . , 332-N, and the third dielectric material, 343-1, 343-2, . . . , 343-N layers may be deposited according to a semiconductor fabrication process such as chemical vapor deposition (CVD) in a semiconductor fabrication apparatus. Embodiments, however, are not limited to this example and other suitable semiconductor fabrication techniques may be used to deposit the alternating layers of the first dielectric material 330, the second dielectric material 333-A, the semiconductor material 332-A, and the third dielectric material 343, in repeating iterations to form the vertical stack 316.

The layers may occur in repeating iterations vertically. In the example of FIG. 3, three tiers, numbered 1, 2, and N, 313-1, 313-2, . . . , 313-N, of the repeating iterations 1-N are shown. Embodiments, however, are not limited to the number of tiers "N". For example, in some embodiments fifty (50) or more tiers (N≥50) may be included. Embodiments, however, are not limited to this example and more or fewer repeating iterations may be included.

Figure 4A:
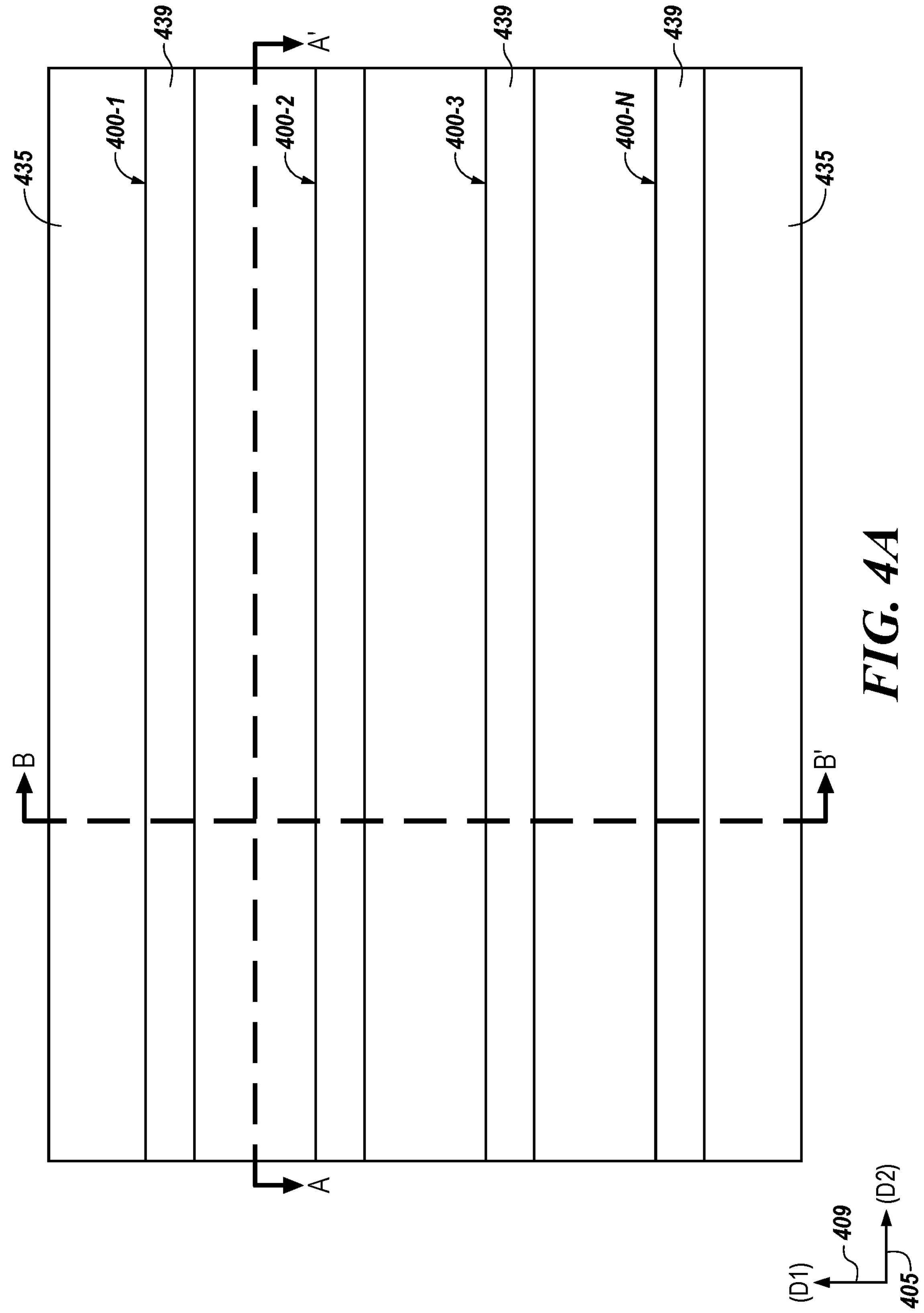
FIGS. 4A-4B illustrate several views of a semiconductor structure at a particular time in the fabrication process in accordance with a number of embodiments of the present disclosure.
Figure 4B:
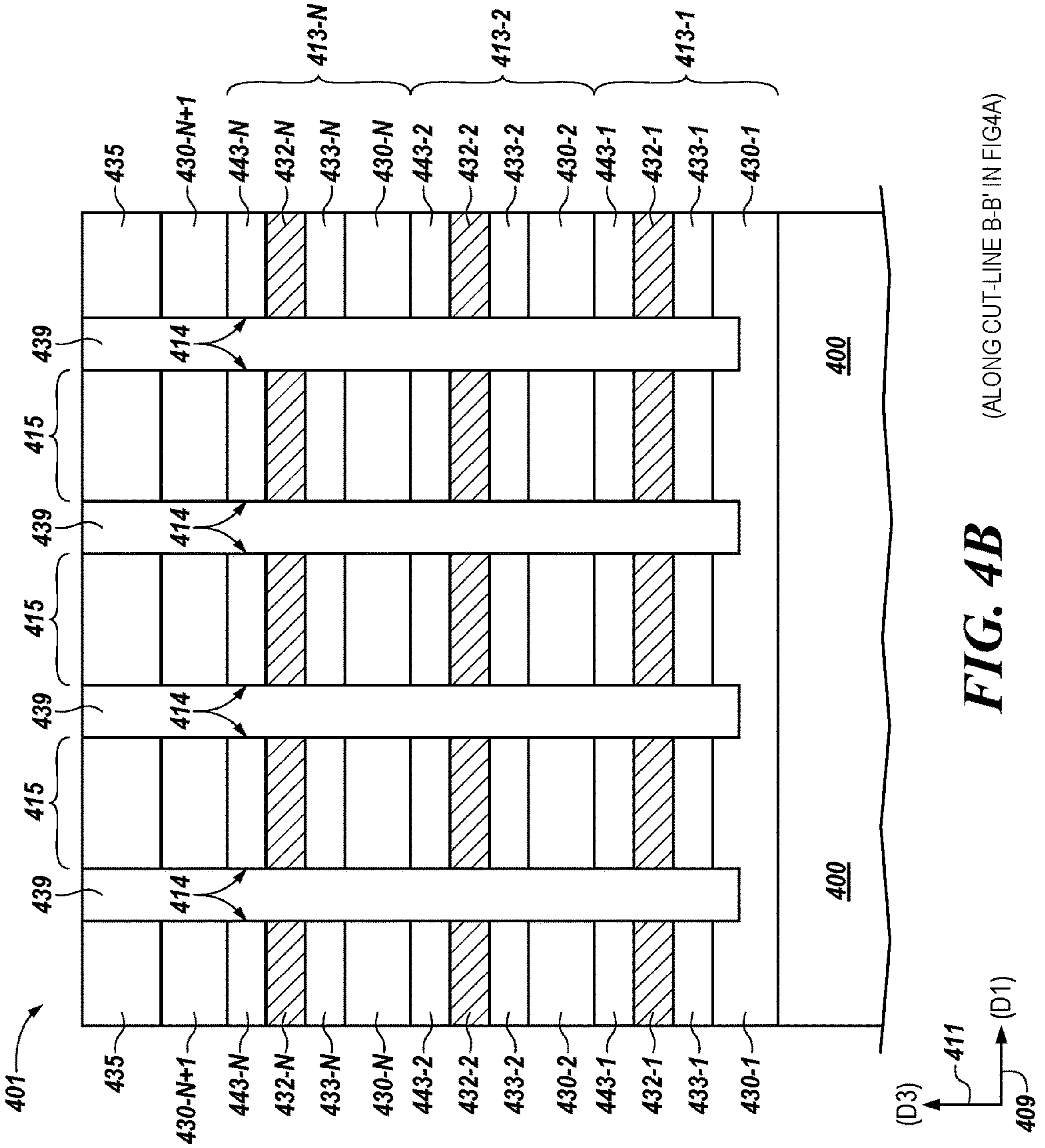

FIGS. 4A-4B illustrate several views of a semiconductor structure at a particular time in the fabrication process in accordance with a number of embodiments of the present disclosure. The semiconductor fabrication process to is to form a structure of hybrid gate dielectric access devices in 3D memory, such as illustrated in FIGS. 1-2, and in accordance with a number of embodiments of the present disclosure.

In the example embodiment shown in the example of FIG. 4A, the method comprises using an etchant process to form a plurality of first vertical openings 400-1, 400-2, . . . , 400-N (sometimes collectively referred to as "400"), having a first horizontal direction (D1) 409 and a second horizontal direction (D2) 405, through the vertical stack to the substrate. In one example, as shown in FIG. 4A, the plurality of first vertical openings 400-1, 400-2, . . . , 400-N are extending predominantly in the second horizontal direction (D2) 405 and may form elongated vertical, pillar columns 413-1, 413-2, . . . , 413-M (collectively and/or independently referred to as 413), with sidewalls 414 in the vertical stack. The plurality of first vertical openings 400 may be formed using photolithographic techniques to pattern a photolithographic mask 435, e.g., to form a hard mask (HM), on the vertical stack prior to etching the plurality of first vertical openings 400-1, 400-2, . . . , 400-N. Similar semiconductor process techniques may be used at other points of the semiconductor fabrication process described herein.

The openings 400-1, 400-2, . . . , 400-N may be filled with a dielectric material 439. In one example, a spin on dielectric process may be used to fill the openings 400-1, 400-2, . . . , 400-N. In one embodiment, the dielectric material 439 may be an oxide material. However, embodiments are not so limited.

FIG. 4B is a cross sectional view, taken along cut-line A-A' in FIG. 4A, showing another view of the semiconductor structure at a particular time in the semiconductor fabrication process. The cross sectional view shown in FIG. 4B shows the repeating iterations of alternating layers of the first dielectric material, 430-1, 430-2, . . . , 430-N, the second dielectric material, 433-1, 433-2, . . . , 433-N, the semiconductor material, 432-1, 432-2, . . . , 432-N, and the third dielectric material, 443-1, 443-2, . . . , 443-N on a semiconductor substrate 400 to form the vertical stack, e.g. 401 as shown in FIG. 4B.

As shown in FIG. 4B, a plurality of first vertical openings may be formed through the layers within the vertically stacked memory cells to expose vertical sidewalls in the vertical stack and form elongated vertical pillar columns 415 and then filled with a first dielectric material 439. The first vertical openings may be formed through the repeating iterations of the first dielectric material 430, the second dielectric material 433, the semiconductor material 432, and the third dielectric material 443, through multiple tiers.

In the example embodiment of FIG. 4B, a first dielectric material 439, such as an oxide or other suitable spin on dielectric (SOD), may be deposited in the first vertical openings, using a process such as CVD, to fill the first vertical openings. First dielectric material 439 may also be formed from a silicon nitride ($Si_3N_4$) material. In another example, the first dielectric material 439 may include silicon oxy-nitride ($SiO_xN_y$), and/or combinations thereof. Embodiments are not limited to these examples.

Figure 5A:
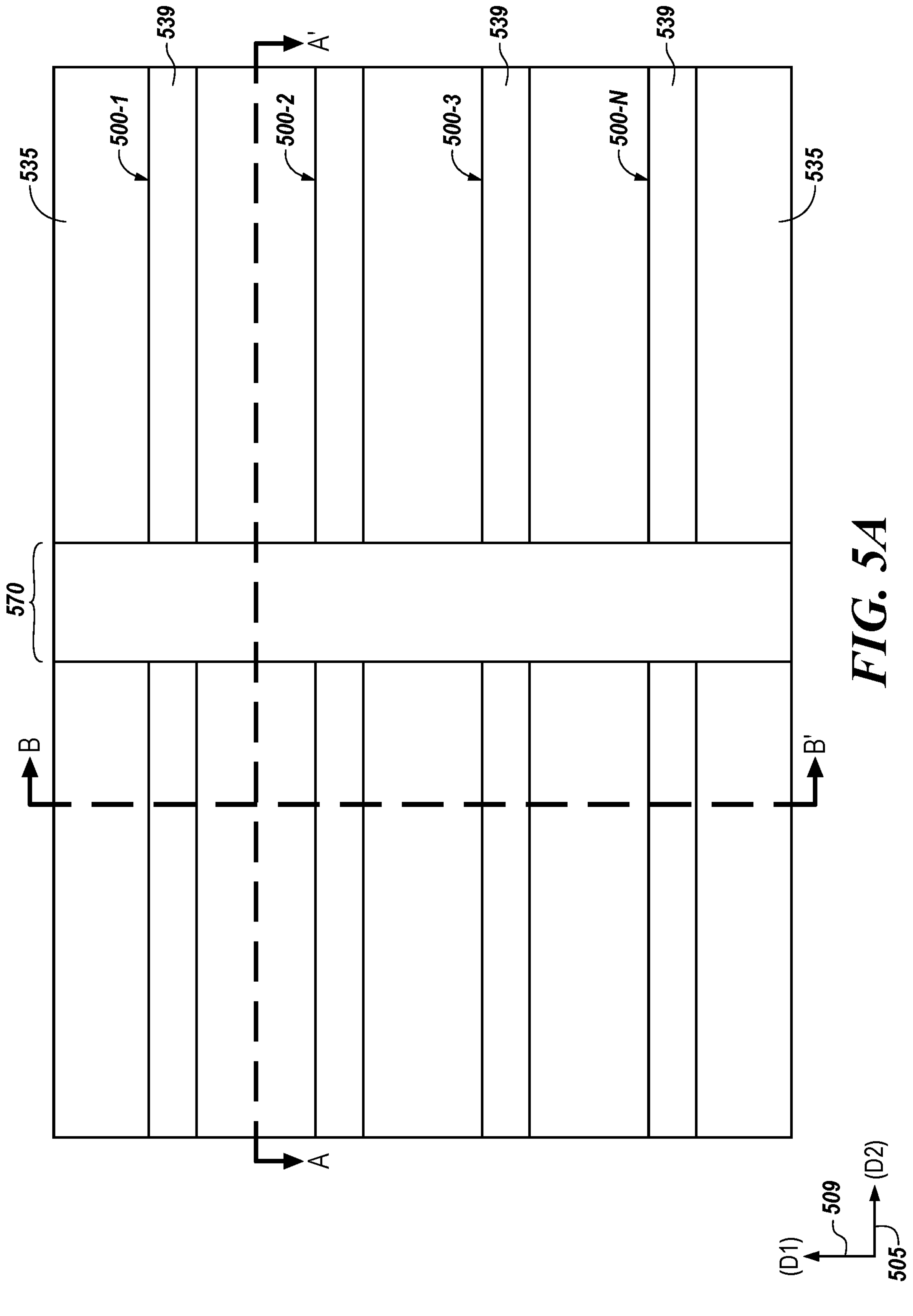

FIGS. 5A-5C illustrate an example method, at another stage of a semiconductor fabrication process, for forming arrays of vertically stacked memory cells, having a twin channel access device for vertical three-dimensional (3D) memory, such as illustrated in FIGS. 1-2, and in accordance with a number of embodiments of the present disclosure.

FIG. 5A illustrates a top down view of a semiconductor structure, at a particular point in time, in a semiconductor fabrication process, according to one or more embodiments. In the example embodiment of FIG. 5A, the method comprises using a photolithographic process to pattern the photolithographic mask 536. The method in FIG. 5A further illustrates using one or more etchant processes to form first vertical openings 570 down through the vertical stack, extending in the first direction (D1) 509.

FIG. 5B illustrates a cross sectional view taken along cut-line A-A' in FIG. 5A. FIG. 5C illustrates a cross sectional view taken along cut-line B-B' in FIG. 5A.

FIGS. 6A-6B illustrate the structure in one example embodiment at a next particular point in the semiconductor fabrication process. FIG. 6A is a cross sectional view taken along cut-line A-A' in FIG. 5A. In the example embodiment of FIG. 6A, a selective etch process may be used to recess the second and the third dielectric materials, 633-1, 633-2, . . . , 633-N and 643-1, 643-2, . . . , 643-N, horizontally to form a horizontal opening, a first distance (L1) from the first vertical opening 670, above and below the semiconductor material 632-1, 632-2, 632-N. FIG. 6B illustrates a cross sectional view taken along cut-line B-B' in FIG. 5A.

In the example embodiment of FIGS. 6A-6B, the method may include flowing a selective etchant into the first vertical opening 670 to selectively etch a portion of the second and third dielectric materials, 633-1, 633-2, . . . , 633-N and 643-1, 643-2, . . . , 643-N, horizontally to form a horizontal opening, a first distance (L1) from the first vertical opening 670, above and below the semiconductor material 632-1, 632-2, 632-N. For example, an etchant may be flowed into the second vertical opening 670 to selectively etch a nitride material, 633-1, 633-2, . . . , 633-N and 643-1, 643-2, . . . , 643-N, horizontally to form a horizontal opening above and below the semiconductor material 632-1, 632-2, 632-N. The etchant may target all iterations of the second and third dielectric material 633-1, 633-2, . . . , 633-N and 643-1, 643-2, . . . , 643-N, horizontally to form a horizontal opening above and below the semiconductor material 632-1, 632-2, 632-N within the stack.

The selective etchant process may consist of one or more etch chemistries selected from an aqueous etch chemistry, a semi-aqueous etch chemistry, a vapor etch chemistry, or a plasma etch chemistries, among other possible selective etch chemistries. For example, a dry etch chemistry of oxygen ($O_2$) or $O_2$ and sulfur dioxide ($SO_2$) ($O_2/SO_2$) may be utilized. As another example, a dry etch chemistries of $O_2$ or of $O_2$ and nitrogen ($N_2$) ($O_2/N_2$) may be used to selectively etch the second and third dielectric material 633-1, 633-2, . . . , 633-N and 643-1, 643-2, . . . , 643-N above and below the semiconductor material 632-1, 632-2, 632-N. Alternatively, or in addition, a selective etch to remove the second and third dielectric material, 633-1, 633-2, . . . , 633-N and 643-1, 643-2, . . . , 643-N, above and below the semiconductor material, 632-1, 632-2, 632-N, may comprise a selective etch chemistry of phosphoric acid ($H_3PO_4$) or hydrogen fluoride (HF) and/or dissolving the second and third dielectric material, 633-1, 633-2, . . . , 633-N and 643-1, 643-2, . . . , 643-N, using a selective solvent, for example $NH_4OH$ or HF, among other possible etch chemistries or solvents. Embodiments are not limited to these examples.

The selective etchant process may etch the nitride material and/or oxide material, 633-1, 633-2, . . . , 633-N and 643-1, 643-2, . . . , 643-N, horizontally to form a horizontal opening above and below the semiconductor material 632-1, 632-2, 632-N as a first horizontal openings 673. The selective etchant process may be performed such that the first horizontal opening 673 has a length or depth (L1) a first distance 676 from the first vertical opening 670. The second and third dielectric material, 633-1, 633-2, . . . , 633-N and 643-1, 643-2, . . . , 643-N, may be etched horizontally a first distance (L1) 676 in a range of approximately fifty (50) to one hundred and fifty (150) nanometers (nm) back from the second vertical opening 670. The first distance (L1) 676 may be controlled by controlling time, composition of etchant gas, and etch rate of a reactant gas flowed into the first vertical opening 670, e.g., rate, concentration, temperature, pressure, and time parameters. The selective etch may be isotropic, but selective to the semiconductor material 632-1, 632-2, 632-N. In this example the first horizontal opening 673 will have a height (H1) substantially equivalent to and be controlled by a thickness, to which the second and third dielectric layers, 633-1, 633-2, . . . , 633-N and 643-1, 643-2, . . . , 643-N, e.g., nitride and/or oxide material, were deposited. Embodiments, however, are not limited to this example.

FIGS. 7A-7D illustrate an example method, at another stage of a semiconductor fabrication process, for forming arrays of vertically stacked memory cells, having hybrid gate dielectric access devices for vertical three-dimensional (3D) memory, such as illustrated in FIGS. 1-2, and in accordance with a number of embodiments of the present disclosure.

FIG. 7A is a cross sectional view taken along cut-line A-A' in FIG. 5A. In the example embodiment shown in FIG. 7A, a multi-layer, hybrid gate dielectric material 738 may be deposited in the plurality of first horizontal openings 773 created by the etched second and third dielectric materials, 733-1, 733-2, . . . , 733-N and 743-1, 743-2, . . . , 743-N. FIG. 7B illustrates a cross sectional view taken along cut-line B-B' in FIG. 5A.

Figure 7C:
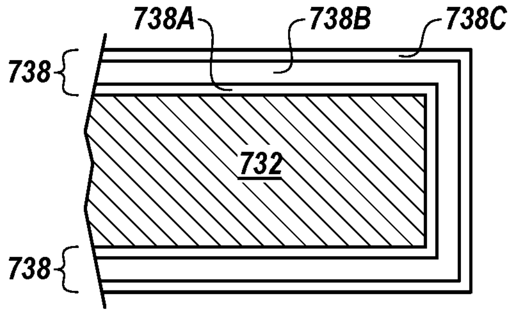
Figure 7D:
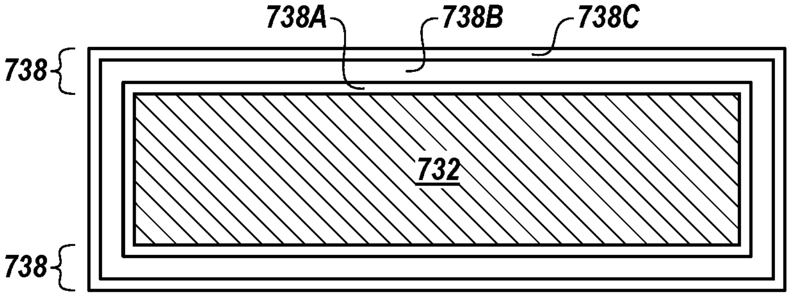

As shown in greater detail in isolated embodiments of FIGS. 7C and 7D, the multi-layer, hybrid gate dielectric material 738 may be deposited in the plurality of first horizontal openings 773 as a series of layers. In one example embodiment, atomic layer deposition (ALD) may be used to sequentially deposit the one or more layers of different dielectric material compositions.

The example embodiment shown in FIGS. 7C and 7D illustrates three (3) distinct layers, a first layer 738A, a second layer 738B, and a third layer 738C, to the multi-layer, hybrid gate dielectric material 738. Embodiments, however, are not limited to this number of layers and more or fewer than three (3) layers may be included in the multi-layer gate dielectric material 738. In one example embodiment all three layers, 738A, 738B, and 738C, may have different dielectric material compositions and/or different thicknesses. In the example embodiment shown in FIGS. 7C and 7D, the first and the third layer 738A and 738C have approximately a same thickness, and the second layer 738B has a thickness different from that of the first layer 738A and the third layer 738C.

In one example embodiment, the first layer 738A and the third layer 738C have approximately an equal thickness ("t1") and a same dielectric material composition. In this example, the second layer 738B has a second thickness ("t2") different from the thickness "t1" of the first and the third layers, 738A and 738C. In one embodiment, the second layer 738B has a second thickness "t2" which is thinner than a thickness "t1" of the first and the third layers, 738A and 738C. In an example embodiment, the first and the third layers, 738A and 738C, include a silicon dioxide ($SiO_2$) dielectric material composition and the second layer 738B includes an aluminum oxide ($Al_2O_3$) dielectric material composition. Embodiments, however, are not limited to this example.

In this example embodiment, the first and the third dielectric layers 738A and 738C may have a first thickness "t1" in a range of approximately thirty (30) to fifty (50) Angstroms (Å). In this example, the second dielectric layer 738B may have a second thickness "t2" in a range of approximately ten (10) to thirty (30) Å. In one example embodiment, the second dielectric material composition is a dielectric material composition with a high effective negative charge, e.g., a fixed negative charge density at least equal to or greater than approximately $-1e^{12}/cm^2$ ($-1e^{12}/cm^2$). According to embodiments, the second dielectric layer 738B can tolerate a high thermal budget, e.g., approximately 1000 degrees Celsius (° C.), suppress Fowler-Nordheim (Fn) tunneling, and provide a greater, total equivalent oxide thickness (EOT) by approximately twenty (20) or greater Angstroms (Å) relative to similar design rule scale and operating parameters.

Further, according to embodiments, using a hybrid gate dielectric achieves a smaller electric field (efield) inside the gate dielectric, without degrading underlap resistance, and while maintaining access device conduction control for current "on" (Ion) in a vertically stacked three-dimensional (3D) memory architecture, having horizontally oriented access devices coupled to horizontally oriented storage nodes. In some embodiments, with a gate all around (GAA) structure, it may be possible to increase EOT gate oxide thickness to approximately one hundred Angstroms (Å) without degrading current "on" (Ion) control. This may relax the "current off" ("Ioff") requirements, lessening current leakage in the access device "off" state while realizing equivalent charge storage retention for thin film transistor (TFT) applications.

As design rules for access devices, e.g., transistors, scale smaller and smaller, fully depleted body threshold voltage (Vt) control becomes more difficult. In some instances, the resulting threshold voltage (Vt) in operation may be measurably lower for horizontally oriented vertically stacked access devices than as used with buried recessed access device (BRAD) architectures, e.g., approximately 500 milliVolts (mV) lower than the Vt used in BRAD operation. Thus, embodiments described herein may enable a higher Vt and better access device conduction control, e.g., current "off" (Ioff) for vertical three-dimensional (3D) memory, e.g., comparable to BRAD devices of a similar design rule scale and operating parameters.

As shown in the embodiments of FIGS. 7C and 7D, the hybrid gate dielectric 738 is a multi-layer dielectric having a first dielectric material 738A and a second dielectric material 738B. In some embodiments, the hybrid gate dielectric material 738 includes a first layer 738A having a surface formed in contact with the channel region 732. A second layer 738B is formed having a surface formed in contact with a surface of the first layer 738A opposite the first layer surface formed in contact with the channel region 732. A third layer 738C may have a surface formed in contact with a surface of the second layer 738B opposite the second layer surface formed in contact with the surface of the first layer 738A. In some embodiments, as described below, a gate may be formed in contact with a surface of the third layer 738C opposite the third layer surface formed in contact with the surface of the second layer 738B.

According to embodiments, the first layer 738A may be formed of a first dielectric material, the second layer may be formed of a second dielectric material, and the third layer 738C may be formed of the first dielectric material. In some embodiments, the first dielectric material 738A is a silicon dioxide ($SiO_2$) dielectric material, and the second dielectric material 738B is an aluminum oxide ($AlO_x$) dielectric material. The second dielectric material 738B may be a dielectric material having an atomic composition with a fixed negative charge of at least $-1e^{-12}$. The second layer 738B may have a vertical thickness (t2) which is less than a vertical thickness (t1) of the first layer and is less than a vertical thickness (t3) of the third layer. In some embodiments, the vertical thickness (t1) of the first layer 738A is less than forty (40) angstroms (Å), and the vertical thickness (t3) of the third layer is less than 40 Å.

As shown in the embodiments of FIGS. 7C and 7D, the gate dielectric material 738 may be conformally deposited all around the semiconductor material 732. The gate dielectric material 738 may be conformally deposited in the plurality of second horizontal openings 773 using a chemical vapor deposition (CVD) process, plasma enhanced CVD (PECVD), atomic layer deposition (ALD), or other suitable deposition process, to cover the semiconductor material 732. By way of example, and not by way of limitation, the gate dielectric 838 may comprise a silicon dioxide ($SiO_2$) material, aluminum oxide ($Al_2O_3$) material, high dielectric constant (k), e.g., high-k, dielectric material, and/or combinations thereof.

FIGS. 8A-8B illustrate an example method, at another stage of a semiconductor fabrication process, for forming arrays of vertically stacked memory cells, having hybrid gate dielectric access devices for vertical three-dimensional (3D) memory, such as illustrated in FIGS. 1-2, and in accordance with a number of embodiments of the present disclosure.

FIG. 8A is a cross sectional view taken along cut-line A-A' in FIG. 5A. In the example embodiment shown in FIG. 8A, a first conductive material 877 may be deposited on the gate dielectric material 838 all around the semiconductor material 832. The first conductive material 877 may be deposited fully around every surface of the semiconductor material, to form gate all around (GAA) gate structures, at the channel region of the semiconductor material 832.

The first conductive material 877 may be conformally deposited into a portion of the second vertical opening 870, using a chemical vapor deposition (CVD) process, plasma enhanced CVD (PECVD), atomic layer deposition (ALD), or other suitable deposition process, such that the first conductive material 877 is fully deposited into the second horizontal opening 873.

In some embodiments, the first conductive material, 877 may comprise one or more of a doped semiconductor, e.g., doped silicon, doped germanium, etc., a conductive metal nitride, e.g., titanium nitride, tantalum nitride, etc., a metal, e.g., tungsten (W), titanium (Ti), tantalum (Ta), ruthenium (Ru), cobalt (Co), molybdenum (Mo), etc., and/or a metal-semiconductor compound, e.g., tungsten silicide, cobalt silicide, titanium silicide, etc, and/or some other combination thereof. The first conductive material 877 with the gate dielectric material 838 may form horizontally oriented access lines opposing a channel region of the semiconductor material 832, such as shown as access lines 107-1, 107-2, . . . , 107-Q in FIGS. 1-2 (which also may be referred to a wordlines). FIG. 8B illustrates a cross sectional view, taken along cut-line B-B' in FIG. 5A, showing continuous horizontal gates extending in the first direction (D1) 809, left and right across the plane of the drawing sheet.

FIGS. 9A-9D illustrates an example method, at another stage of a semiconductor fabrication process, for forming arrays of vertically stacked memory cells, having hybrid gate dielectric access devices for vertical three-dimensional (3D) memory, such as illustrated in FIGS. 1-2, and in accordance with a number of embodiments of the present disclosure.

FIG. 9A illustrates a cross sectional view taken along cut-line A-A' in FIG. 5A. The cross-sectional view shown in FIG. 9A illustrates that the first conductive material 977 may be recessed back in the second horizontal opening 973, e.g., etched away from the first vertical opening 970 using an atomic layer etching (ALE) or other suitable technique. In some examples, the first conductive material 977 may be etched back in the horizontal openings 973 a third distance (L3) 983 into the continuous second horizontal openings 973. In some embodiments, the first conductive material 977 may be etched back in the horizontal opening 973 a third distance (L3) 983 in a range of twenty (20) to fifty (50) nanometers (nm) back from the third vertical opening 970. The first conductive material 977 may be selectively etched, leaving the gate dielectric material 938 intact.

FIG. 9B illustrates an example embodiment of the structure at another point in time in the semiconductor fabrication process. FIG. 9B is a cross sectional view taken along cut-line A-A' in FIG. 5A. As shown in the embodiment of FIG. 9B, another dielectric material 984 may be deposited to fill the second horizontal openings 973 from the recessed first conductive material 977, and to fill, at least conformally on the vertical sidewalls, the third vertical opening 970.

In some embodiments the "another dielectric material", e.g., 984, may be the same material or a different material as the first and the second, and/or the third dielectric materials, 930, 933, and 943. For example, the dielectric material may be $Si_3N_4$. In another example, the dielectric materials may comprise a silicon dioxide ($SiO_2$) material. In another example, the dielectric materials may comprise a silicon oxy-carbide ($SiO_xC_y$) material. In another example, the dielectric materials may include silicon oxy-nitride ($SiO_xN_y$), and/or combinations thereof. Embodiments are not limited to these examples.

FIG. 9C is also a cross sectional view taken along cut-line A-A' in FIG. 5A. FIG. 9C illustrates that the dielectric 984 may be etched to remove from the vertical sidewalls of the third vertical opening 970. A selective etch may also be performed to remove the gate dielectric from the vertical sidewalls of the third vertical opening 970.

FIG. 9D is a further cross sectional view taken along cut-line A-A' in FIG. 5A at another stage of a semiconductor fabrication process, for forming arrays of vertically stacked memory cells, having a twin channel access device for vertical three-dimensional (3D) memory. As shown in the example embodiment of FIG. 9D a gas phase doping process may then be used to form first source/drain regions 921 in exposed vertical surfaces of the semiconductor material 932. The first vertical opening 970 may then be refilled with another dielectric, e.g., 984, as described above.

Figure 10A:
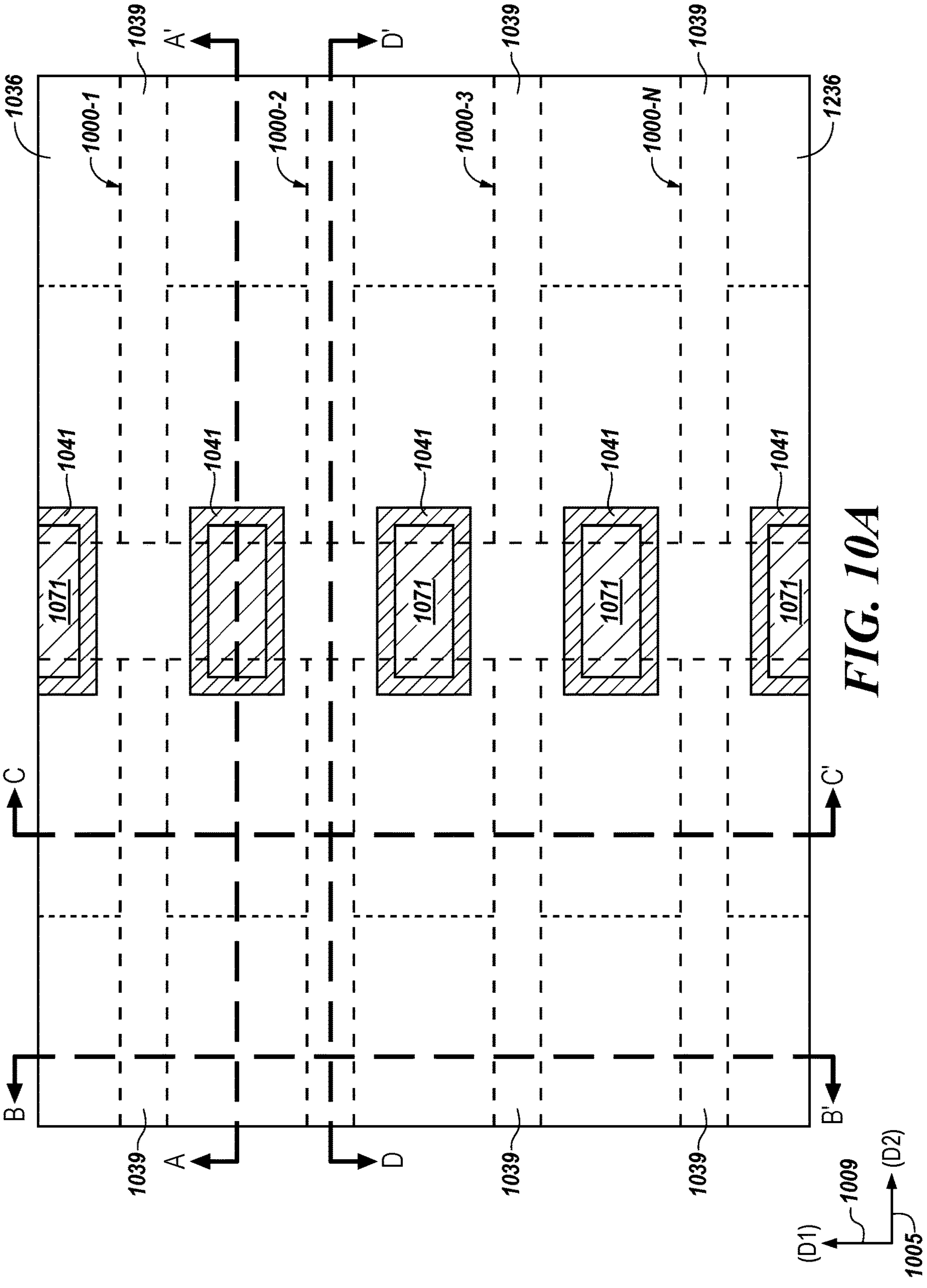

FIGS. 10A-10B illustrate several views of an example method, at another stage of a semiconductor fabrication process, for forming arrays of vertically stacked memory cells, having hybrid dielectric access devices for vertical three-dimensional (3D) memory, such as illustrated in FIGS. 1-2, and in accordance with a number of embodiments of the present disclosure.

FIG. 10A illustrates a top down view of a semiconductor structure, at a particular point in time, in a semiconductor fabrication process, according to one or more embodiments. In the example embodiment of FIG. 10A, the method comprises using a photolithographic process to pattern a photolithographic mask 1036 to form a plurality of patterned third vertical openings through the vertical stack adjacent the first source/drain regions 1021 in which to deposit a second conductive material 1041 for forming vertically oriented digit lines 1041 and 1071.

FIG. 10B illustrates a cross sectional view taken along cut-line A-A' in FIG. 10A. As illustrated in in FIG. 10B, the method further illustrates using one or more etchant processes to form the plurality of patterned third vertical openings through the vertical stack adjacent first source/drain regions 1021. As illustrated in FIG. 10B, in some example embodiments, a highly doped semiconductor material, as the second conductive material 1041, may be formed vertically in the third vertical openings 1070. The second conductive material 1041 may be in direct electrical contact with the first source/drain regions, 1021. The second conductive material 1041 may be a high concentration, n-type dopant polysilicon material. For example, the high concentration, n-type dopant may be formed by depositing a highly phosphorus (P) doped (n+ type) polysilicon germanium (SiGe) material as the second conductive material 1041.

In some embodiments the first source/drain regions 1021 may be formed by out-diffusing n-type (n+) dopants into the semiconductor material 1032. For example, the plurality of patterned third vertical openings may be adjacent the first source/drain regions 1021 and the high concentration, n-type dopant may be out-diffused into the low doped semiconductor material 1032-1, 1032-2, . . . , 1032-N, etc., in each tier using an annealing process to form the first source/drain regions 1021.

In some embodiments, the second conductive material 1041 may comprise a titanium/titanium nitride (TiN) second conductive material 1041. The TiN second conductive material 1041 may be annealed to form a titanium silicide with the first source/drain regions 1021 of the hybrid gate dielectric access devices for vertical three-dimensional (3D) memory.

As shown in the example embodiment of FIG. 10B, the method may additionally include depositing a third conductive material 1071, e.g., a metal layer, on the titanium/titanium nitride (TiN) second conductive material 1041, which forms the titanium silicide with the first source/drain regions 1021 in the plurality of patterned third vertical openings 1070 to fill and form bi-layer, vertically oriented digit lines 1041 and 1071. In some embodiments the depositing a metal layer 1071 may include depositing a cobalt (Co) material layer 1071 on the titanium/titanium nitride (TiN) second conductive material 1041 which forms the titanium silicide with the first source/drain regions 1021 of the hybrid gate dielectric access devices for vertical three-dimensional (3D) memory.

In some embodiments, depositing a metal layer 1071 on the second conductive material 1041 may comprise depositing a Ruthenium (Ru) material 1071. In some embodiments, depositing a metal layer 1071 on the second conductive material 1041 may comprised depositing a tungsten (W) material 1071. Depositing the metal layer 1071 may include chemical vapor deposition, or other suitable deposition technique. Embodiments, however, are not limited to these examples.

FIGS. 11A-11E illustrate a view of a semiconductor device in fabrication, at another stage of a semiconductor device fabrication process, for forming arrays of vertically stacked memory cells, having hybrid dielectric access devices for vertical three-dimensional (3D) memory, such as illustrated in FIGS. 1-2, and in accordance with a number of embodiments of the present disclosure.

Figure 11A:
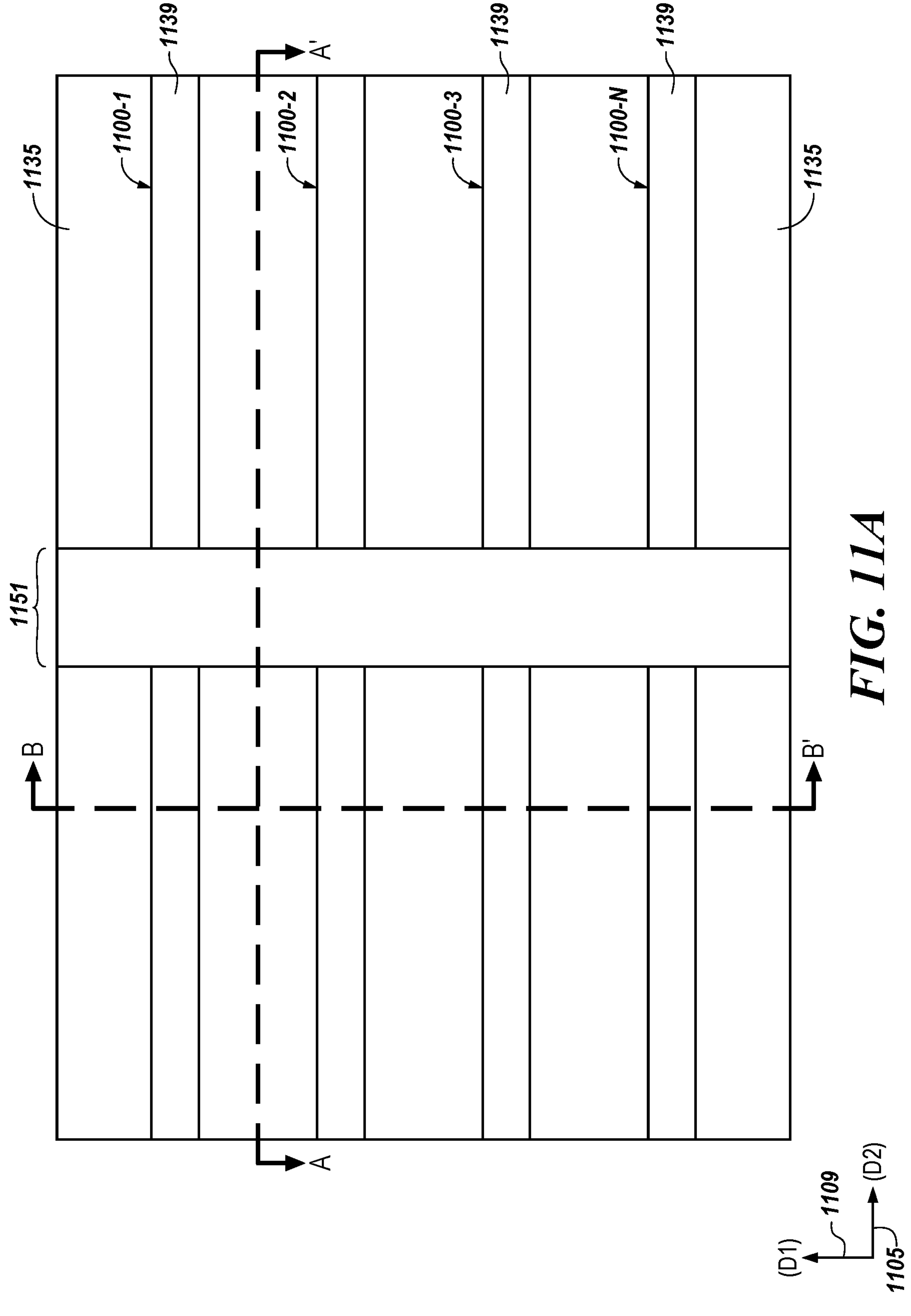

FIG. 11A illustrates a top down view example method, at another stage of a semiconductor fabrication process, for forming arrays of vertically stacked memory cells, having twin channel access device for vertical three-dimensional (3D) memory. In the example embodiment of FIG. 11A, the method comprises using a photolithographic process to pattern the photolithographic mask 1035. The method in FIG. 11A further illustrates using one or more etchant processes to form a vertical opening 1151 in a storage node region through the vertical stack and extending predominantly in the first horizontal direction (D1) 1109. The one or more etchant processes forms a vertical opening 1151 to expose sidewalls in the repeating iterations of alternating layers of the first dielectric material 1130, the second dielectric material 1133, the semiconductor material, 1132, and the third dielectric material 1143, in the vertical stack, shown in FIGS. 11B-11E, adjacent a storage node region of the semiconductor material.

In some embodiments, this process may be performed before the hybrid gate dielectric access device semiconductor fabrication process described in connection with FIGS. 5-9. However, the embodiment shown in FIGS. 11B-11E illustrates a sequence in which the storage node fabrication process is performed "after" the hybrid gate dielectric access device formation.

FIG. 11B illustrates a cross sectional view, taken along cut-line A-A' in FIG. 11A, showing a view of the semiconductor structure at this point in one example semiconductor fabrication process of an embodiment of the present disclosure. According to this example embodiment, shown in FIG. 11B, the method comprises forming the first vertical opening 1151 in the vertical stack (shown in FIG. 3).

FIG. 11C illustrates a cross sectional view, taken along cut-line A-A' in FIG. 11A, showing a view of the semiconductor structure at a next point in one example semiconductor fabrication process of an embodiment of the present disclosure. The example embodiment shown in FIG. 11C illustrates selectively etching the semiconductor material, 1132-1, 1132-2, . . . , 1132-N and the second and the third dielectric materials, 1133-1, 1133-2, . . . , 1133-N and 1143-1, 1143-2, . . . , 1143-N, in the storage node region to form third horizontal openings 1179 a third horizontal distance (L3) back from the vertical opening 1151 in the vertical stack (FIG. 3). According to embodiments, selectively etching the storage node region of the semiconductor material, 1132-1, 1132-2, . . . , 1132-N and the second and the third dielectric materials, 1133-1, 1133-2, . . . , 1133-N and 1143-1, 1143-2, . . . , 1143-N, can comprise using an atomic layer etching (ALE) process. Embodiments, however, are not limited to this example. The selective etch process may be selective to the first dielectric material 1130-1, 1130-2, . . . , 1130-N+1.

Figure 11D:
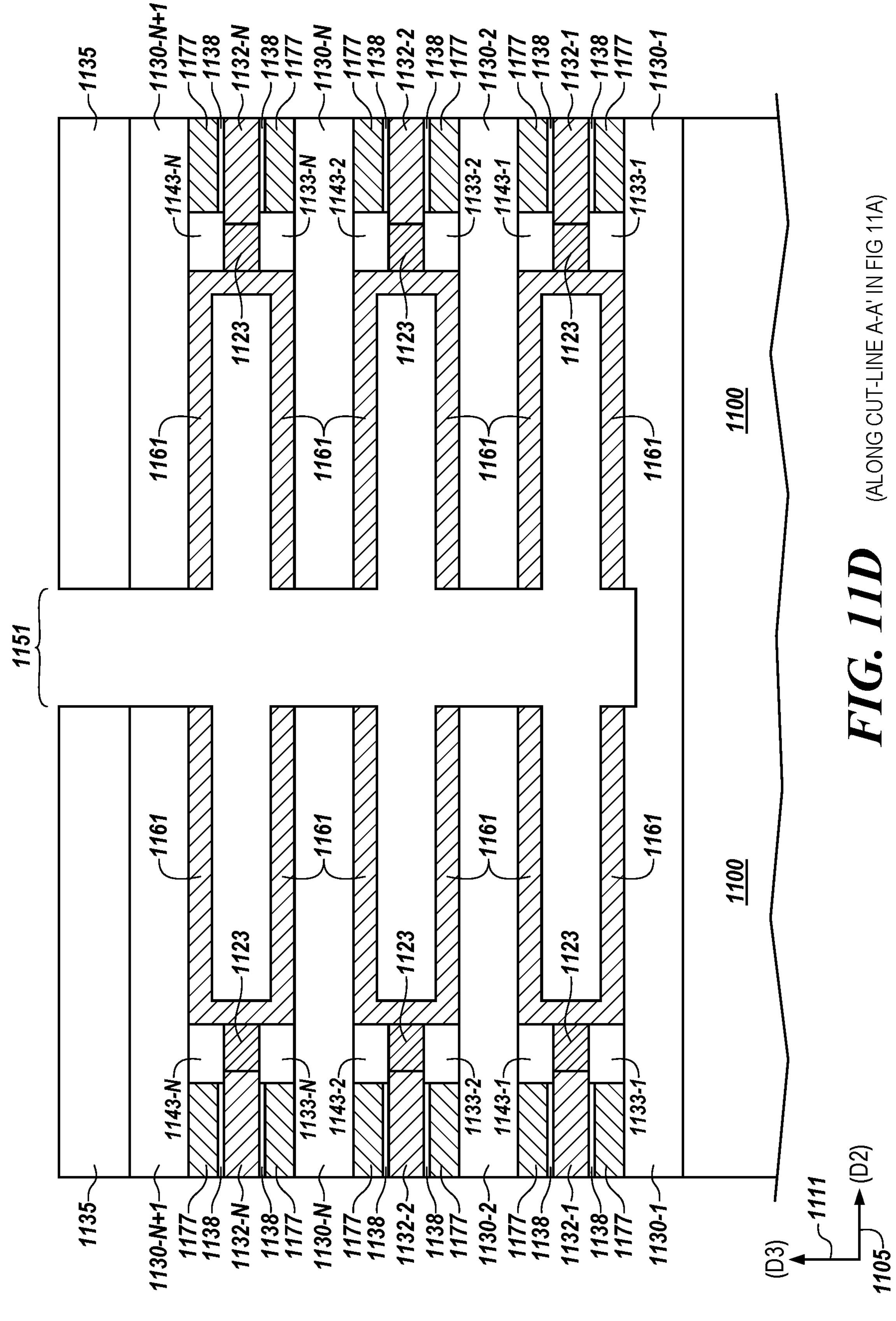

FIG. 11D illustrates a cross sectional view, taken along cut-line A-A' in FIG. 11A, showing another view of the semiconductor structure at another point in one example semiconductor fabrication process of an embodiment of the present disclosure. As shown in the example embodiment of FIG. 11D, source/drain regions 1123 (e.g., second source/drain regions within each tier) can be formed in the semiconductor material, 1132-1, 1132-2, . . . , 1132-N at a distal end of the first horizontal openings 1179 from the third vertical opening 1151.

The second source/drain regions 1123 may be formed by gas phase doping a dopant into an edge surface portion of the semiconductor material 1132. In some embodiments, the second source/drain regions 1123 may be adjacent a channel region 1132. In one example, gas phase doping may be used to achieve a highly isotropic e.g., non-directional doping, to form the second source/drain regions 1123 for the hybrid gate dielectric, horizontally oriented access devices. In another example, thermal annealing with doping gas, such as phosphorous may be used with a high energy plasma assist to break the bonding. Embodiments, however, are not so limited and other suitable semiconductor fabrication techniques may be utilized.

In some embodiments the second source/drain regions 1123 may be formed by flowing a high energy gas phase dopant, such as Phosphorous (P) for an n-type transistor, into the vertical and horizontal openings 1151 and 1179 to dope the dopant in the semiconductor material, 1132-1, 1132-2, . . . , 1132-N at a distal end of the third horizontal openings 1179 from the vertical opening 1151.

As shown in the embodiment of FIG. 11D, a vertical direction 1111 is illustrated as a third direction (D3), e.g., z-direction in an x-y-z coordinate system, analogous to the third direction (D3) 111, among first, second, and third directions, shown in FIGS. 1-2. The plane of the drawing sheet, extending right and left, is in a second direction (D2) 1105 along an axis of orientation of the horizontal access devices and horizontal storage nodes of the arrays of vertically stacked memory cells of the three-dimensional (3D) memory. In the example embodiment of FIG. 12C, the materials within the vertical stack, e.g., the repeating iterations of alternating layers of a first dielectric material, 1130-1, 1130-2, . . . , 1130-N+1, a second dielectric material, 1133-1, 1133-2, . . . , 1133-N, a semiconductor material, 1132-1, 1132-2, . . . , 1132-N, and a third dielectric material, 1143-1, 1143-2, . . . , 1143-N, are extending into and out of the plane of the drawing sheet in first direction (D1).

As shown in the embodiment of FIG. 12D, a first electrode 1161, e.g., bottom electrode, may then be deposited in the first vertical opening 1151 and the third horizontal openings 1179 in direct electrical contact with the source/drain regions 1123 formed in the semiconductor material, 1132-1, 1132-2, . . . , 1132-N at a distal end of the first horizontal openings 1179. In one example embodiment, the first electrode 1261 may be conformally deposited using atomic layer deposition (ALD). Embodiments, however, are not limited to this example.

To note, source/drain region references may be enumerated herein to denote two separate and distinct source/drain regions, it is not intended that the source/drain region referred to as the "first" and/or "second" source/drain regions have some unique meaning. It is intended only to illustrate that source/drain regions on one side of a channel region may be connected to a digit line, e.g., 103-2 in FIG. 1, and the other source/drain regions on another side of a channel may be connected to a storage node.

Figure 11E:
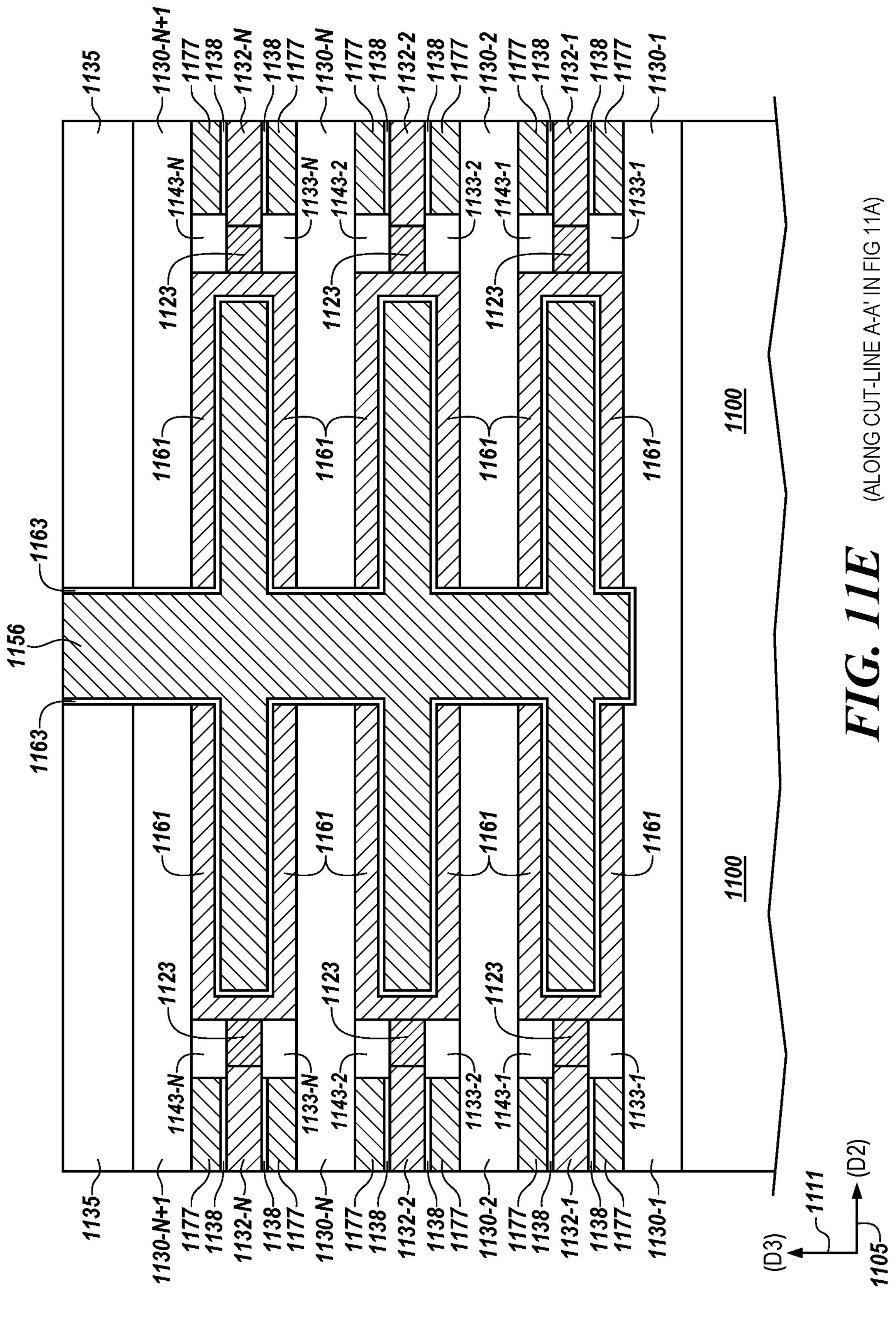

FIG. 11E illustrates a cross sectional view, taken along cut-line A-A' in FIG. 11A, showing a view of the semiconductor structure at another point in one example semiconductor fabrication process of an embodiment of the present disclosure. The example embodiment of FIG. 11E further illustrates filling the first vertical opening 1151 and the first horizontal openings 1179 with a storage node, e.g., cell, dielectric 1163. In one example embodiment, the cell dielectric 1163 may be conformally deposited on the first electrode 1161 (also referred to as a bottom electrode (BE)) in the third vertical openings 1151, the third horizontal openings 1179, and on other exposed surfaces. In one embodiment, the cell dielectric 1163 may be a high-K dielectric, as described herein, conformally deposited to a thickness (tc) in a range of approximately 2 to 10 nanometers (nm). Embodiments, however, are not limited to this example thickness. Other suitable thicknesses may be achieved.

As shown in the example embodiment of FIG. 11E a second electrode 1156 may be deposited by chemical vapor deposition (CVD), or other suitable technique, on the cell dielectric 1163 in the third vertical openings, the third horizontal openings, and on other exposed surfaces, to fill the third vertical openings. In some embodiments the second electrode 1156 may also be referred to as a top electrode (TE), common electrode (CE), and/or top plate electrode. Embodiments, however, are not limited to these examples. Other suitable semiconductor fabrication techniques and/or storage nodes structures, such as ferroelectric cells, may be used.

Figure 12:
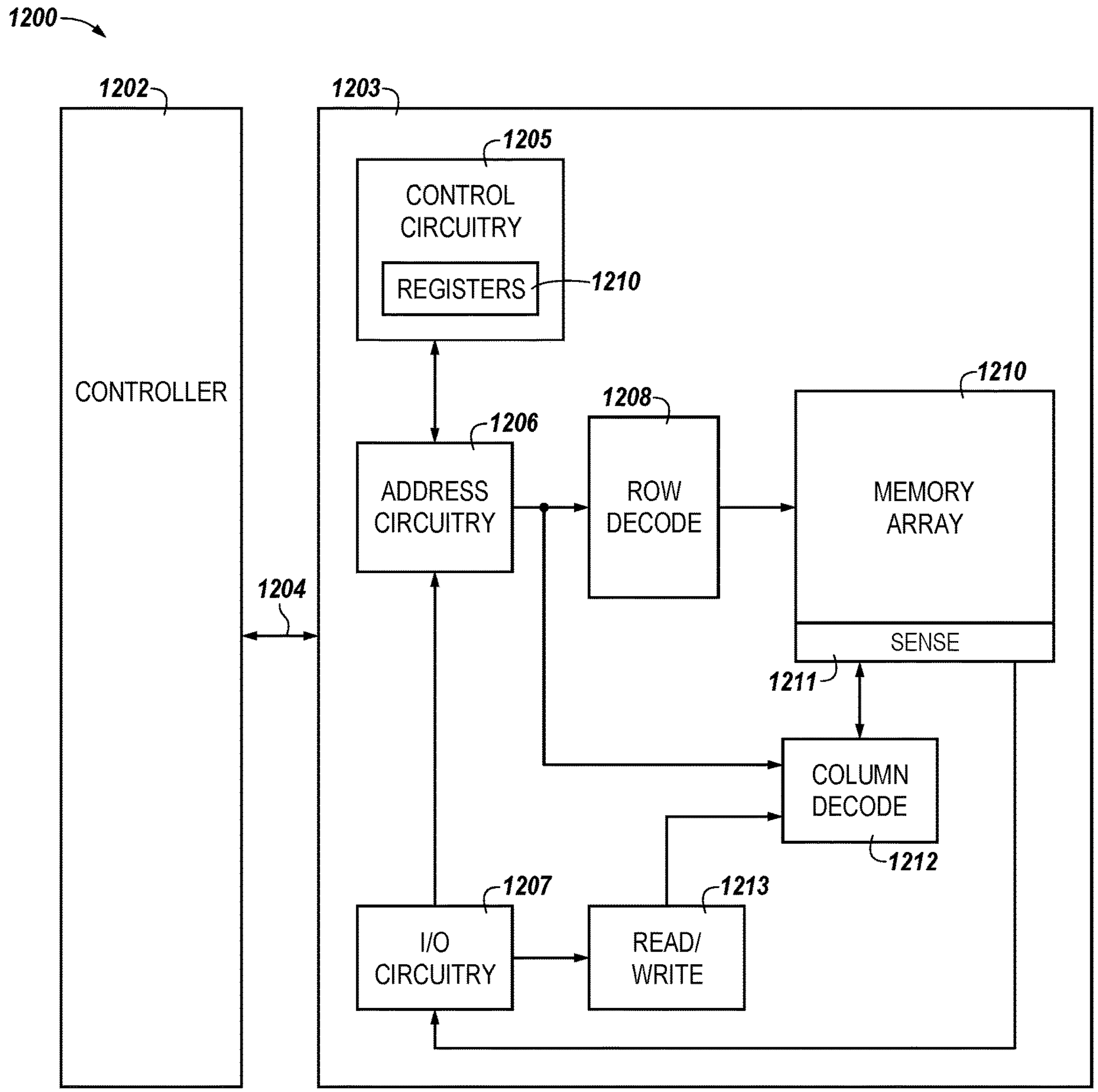
FIG. 12 is a block diagram of an apparatus in accordance with a number of embodiments of the present disclosure.

FIG. 12 is a block diagram of an apparatus in accordance with a number of embodiments of the present disclosure. FIG. 12 is a block diagram of an apparatus in the form of a computing system 1207 including a memory device 1208 in accordance with a number of embodiments of the present disclosure. As used herein, a memory device 1208, a memory array 1210, and/or a host 1201, for example, might also be separately considered an "apparatus." According to embodiments, the memory device 1201 may comprise at least one memory array 1210 with a memory cell formed having a twin channel access device for vertical three-dimensional (3D) that includes horizontally oriented access devices coupled to horizontally oriented storage nodes and includes horizontally oriented access lines and vertically oriented digit lines.

In this example, system 1207 includes a host 1201 coupled to memory device 1208 via an interface 1213. The computing system 1207 can be a personal laptop computer, a desktop computer, a digital camera, a mobile telephone, a memory card reader, or an Internet-of-Things (IOT) enabled device, among various other types of systems. Host 1201 can include a number of processing resources, e.g., one or more processors, microprocessors, or some other type of controlling circuitry, capable of accessing memory 1208. The system 1207 can include separate integrated circuits, or both the host 1201 and the memory device 1208 can be on the same integrated circuit. For example, the host 1201 may be a system controller of a memory system comprising multiple memory devices 1208, with the system controller 1209 providing access to the respective memory devices 1208 by another processing resource such as a central processing unit (CPU).

In the example shown in FIG. 8, the host 1201 is responsible for executing an operating system (OS) and/or various applications, e.g., processes, that can be loaded thereto, e.g., from memory device 1208 via controller 1209. The OS and/or various applications can be loaded from the memory device 1208 by providing access commands from the host 1201 to the memory device 1208 to access the data comprising the OS and/or the various applications. The host 1201 can also access data utilized by the OS and/or various applications by providing access commands to the memory device 1208 to retrieve said data utilized in the execution of the OS and/or the various applications.

For clarity, the system 1207 has been simplified to focus on features with particular relevance to the present disclosure. The memory array 1210 can be a DRAM array comprising at least one memory cell having a digit line and body contact formed according to the techniques described herein. For example, the memory array 1210 can be an unshielded DL 4F2 array such as a 3D-DRAM memory array. The array 1210 can comprise memory cells arranged in rows coupled by word lines, which may be referred to herein as access lines or select lines, and columns coupled by digit lines, which may be referred to herein as sense lines or data lines. Although a single array 1210 is shown in FIG. 8, embodiments are not so limited. For instance, memory device 1208 may include a number of arrays 1210, e.g., a number of banks of DRAM cells.

The memory device 1201 includes address circuitry 1203 to latch address signals provided over an interface 1213. The interface can include, for example, a physical interface employing a suitable protocol, e.g., a data bus, an address bus, and a command bus, or a combined data/address/command bus. Such protocol may be custom or proprietary, or the interface 1213 may employ a standardized protocol, such as Peripheral Component Interconnect Express (PCIe), Gen-Z, CCIX, or the like. Address signals are received and decoded by a row decoder 1206 and a column decoder 1204 to access the memory array 1210. Data can be read from memory array 1210 by sensing voltage and/or current changes on the sense lines using sensing circuitry 1211. The sensing circuitry 1211 can comprise, for example, sense amplifiers that can read and latch a page, e.g., row, of data from the memory array 1210. The I/O circuitry 1212 can be used for bi-directional data communication with the host 1201 over the interface 1213. The read/write circuitry 1205 is used to write data to the memory array 1210 or read data from the memory array 1210. As an example, the circuitry 1205 can comprise various drivers, latch circuitry, etc.

Control circuitry 1209 decodes signals provided by the host 1201. The signals can be commands provided by the host 1201. These signals can include chip enable signals, write enable signals, and address latch signals that are used to control operations performed on the memory array 1210, including data read operations, data write operations, and data erase operations. In various embodiments, the control circuitry 1209 is responsible for executing instructions from the host 1201. The control circuitry 1209 can comprise a state machine, a sequencer, and/or some other type of control circuitry, which may be implemented in the form of hardware, firmware, or software, or any combination of the three. In some examples, the host 1201 can be a controller external to the memory device 1208. For example, the host 1201 can be a memory controller which is coupled to a processing resource of a computing device.

The term semiconductor can refer to, for example, a material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial silicon supported by a base semiconductor structure, as well as other semiconductor structures. Furthermore, when reference is made to a semiconductor in the preceding description, previous process steps may have been utilized to form regions/junctions in the base semiconductor structure, and the term semiconductor can include the underlying materials containing such regions/junctions.

As used herein, "a number of" or a "quantity of" something can refer to one or more of such things. For example, a number of or a quantity of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements, e.g., by direct physical contact, indirectly coupled and/or connected with intervening elements, or wirelessly coupled. The term coupled may further include two or more elements that co-operate or interact with each other, e.g., as in a cause and effect relationship. An element coupled between two elements can be between the two elements and coupled to each of the two elements.

It should be recognized the term vertical accounts for variations from "exactly" vertical due to routine manufacturing, measuring, and/or assembly variations and that one of ordinary skill in the art would know what is meant by the term "perpendicular." For example, the vertical can correspond to the z-direction. As used herein, when a particular element is "adjacent to" an other element, the particular element can cover the other element, can be over the other element or lateral to the other element and/or can be in direct physical contact the other element. Lateral to may refer to the horizontal direction, e.g., the y-direction or the x-direction, that may be perpendicular to the z-direction, for example.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. A memory device, comprising:
a horizontally oriented access device having a first source/drain region and a second source/drain region separated by a channel region, the access device being operatively controlled by a gate;
a hybrid gate dielectric separating the gate from the channel region, wherein:
the hybrid gate dielectric comprises:
a first layer having a surface formed in contact with the channel region;
a second layer having a surface formed in contact with a surface of the first layer opposite the first layer surface formed in contact with the channel region; and
a third layer having a surface formed in contact with a surface of the second layer opposite the second layer surface formed in contact with the surface of the first layer;
the gate is formed in contact with a surface of the third layer opposite the third layer surface formed in contact with the surface of the second layer; and
the second layer has a vertical thickness (t2) which is less than a vertical thickness (t1) of the first layer and is less than a vertical thickness (t3) of the third layer; and
a horizontally oriented storage node coupled to the second source/drain region of the access device.

2. The memory device of claim 1, wherein the hybrid gate dielectric is a multi-layer dielectric having a first dielectric material and a second dielectric material.

3. The memory device of claim 1, wherein the first layer is formed of a first dielectric material, the second layer is a second dielectric material, and the third layer is formed of the first dielectric material.

4. The memory device of claim 3, wherein the first dielectric material is a silicon dioxide ($SiO_2$) dielectric material, and the second dielectric material is an aluminum oxide ($AlO_x$) dielectric material.

5. The memory device of claim 3, wherein the second dielectric material is a dielectric material having an atomic composition with a fixed negative charge density of at least $-1e^{12}/cm^2$.

6. The memory device of claim 1, wherein the vertical thickness (t1) of the first layer is less than forty (40) angstroms (Å), and the vertical thickness (t3) of the third layer is less than 40 Å.

7. The memory device of claim 1, wherein the gate is a gate all around (GAA) structure opposing the channel region.

8. The memory device of claim 1, wherein the gate is a horizontally oriented gate, and the first source/drain region is coupled to a vertically oriented digit line.

9. The memory device of claim 1, wherein the access device is a thin film transistor (TFT) and the storage node is a horizontally oriented capacitor.

10. A memory device, comprising:
a horizontally oriented access device having a first source/drain region and a second source/drain region separated by a channel region, the access device being operatively controlled by a gate opposing the channel region;
a multi-layer gate dielectric having a first dielectric material and a second dielectric material separating the gate from the channel region, the second dielectric material being different from the first dielectric material, wherein:
the multi-layer gate dielectric comprises:
a first layer having a surface formed in contact with the channel region;
a second layer having a surface formed in contact with a surface of the first layer opposite the first layer surface formed in contact with the channel region; and
a third layer having a surface formed in contact with a surface of the second layer opposite the second layer surface formed in contact with the surface of the first layer;
the gate is formed in contact with a surface of the third layer opposite the third layer surface formed in contact with the surface of the second layer; and
the second layer has a vertical thickness (t2) which is less than a vertical thickness (t1) of the first layer and is less than a vertical thickness (t3) of the third layer;
a horizontally oriented storage node coupled to the second source/drain region of the access device; and
a vertically oriented digit line coupled to the first source/drain region of the access device.

11. The memory device of claim 10, wherein the gate is a gate all around (GAA) structure separated from the channel region by the multi-layer gate dielectric.

12. The memory device of claim 10, wherein the storage node is located in a same plane horizontally with the horizontally oriented access device.

13. A method of forming vertical three-dimensional (3D) memory, comprising:
forming a first horizontally oriented thin film transistor (TFT) in a first horizontal tier of a multi-tier 3D memory, the first TFT having a first source/drain region and a second source/drain region separated by a channel region;
forming a multi-layer gate dielectric, having a first dielectric material as a first layer and a second dielectric material as a second layer, separating a gate from the channel region to form an access device, the second dielectric material being different from the first dielectric material, wherein the first dielectric material is formed to have a first vertical thickness (t1), and wherein the second dielectric material is formed to have a second vertical thickness (t2) which is less than the first vertical thickness (t1);
forming a horizontally oriented storage node coupled to the second source/drain region of the access device; and
forming a vertically oriented digit line coupled to the first source/drain region of the access device.

14. The method of claim 13, forming the multi-layer gate dielectric, comprising:
forming a first layer having a surface in contact with the channel region;
forming a second layer having a surface formed in contact with the first layer;
forming a third layer having a surface formed in contact with the second layer; and forming the gate in contact with a surface of the third layer.

15. The method of claim 13, comprising:

forming a silicon dioxide ($SiO_2$) layer as the first dielectric material; and forming an aluminum oxide ($Al_2O_3$) layer as the second dielectric material.

16. The method of claim 13, comprising forming the second dielectric material of a dielectric material having an atomic composition with a fixed negative charge density of at least $-1e^{12}/cm^2$.

17. The method of claim 13, comprising forming the gate as a gate all around (GAA) structure separated from the channel region by the multi-layer gate dielectric.

* * * * *